United States Patent
Song

(10) Patent No.: US 9,632,868 B2
(45) Date of Patent: Apr. 25, 2017

(54) STORAGE DEVICE INCLUDING NONVOLATILE MEMORY AND MEMORY CONTROLLER AND OPERATING METHOD OF STORAGE DEVICE

(71) Applicant: Byungjune Song, Suwon-Si (KR)

(72) Inventor: Byungjune Song, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 14/743,279

(22) Filed: Jun. 18, 2015

(65) Prior Publication Data

US 2015/0370629 A1    Dec. 24, 2015

(30) Foreign Application Priority Data

Jun. 23, 2014    (KR) .................... 10-2014-0076528

(51) Int. Cl.
| | | |
|---|---|---|
| G11C 11/34 | (2006.01) | |
| G06F 11/10 | (2006.01) | |
| G11C 11/56 | (2006.01) | |
| G11C 16/34 | (2006.01) | |
| G11C 29/02 | (2006.01) | |

(52) U.S. Cl.
CPC ...... *G06F 11/1048* (2013.01); *G11C 11/5642* (2013.01); *G11C 16/349* (2013.01); *G11C 29/021* (2013.01); *G11C 29/028* (2013.01)

(58) Field of Classification Search
CPC ............. G06F 11/1016; G06F 11/1072; G11C 11/5642; G11C 29/028; G11C 29/021; G11C 16/349
See application file for complete search history.

(56) References Cited

U.S. PATENT DOCUMENTS

| | | |
|---|---|---|
| 8,154,921 B2 | 4/2012 | Mokhlesi et al. |
| 8,331,169 B1 | 12/2012 | Yang et al. |
| 8,514,646 B1 | 8/2013 | Nan |
| 8,611,157 B2 | 12/2013 | Dutta |
| 8,635,509 B2 | 1/2014 | Choi et al. |
| 2011/0289388 A1 | 11/2011 | Nelson et al. |
| 2012/0239976 A1 | 9/2012 | Cometti et al. |
| 2012/0240007 A1 | 9/2012 | Barndt et al. |
| 2012/0275234 A1* | 11/2012 | Lee .................... G11C 16/0483 365/185.23 |
| 2013/0080691 A1 | 3/2013 | Weingarten et al. |

(Continued)

FOREIGN PATENT DOCUMENTS

WO    WO 2013/147803 A1    10/2013

*Primary Examiner* — Richard Elms
*Assistant Examiner* — Mohammed A Bashar
(74) *Attorney, Agent, or Firm* — Volentine & Whitt, PLLC

(57) ABSTRACT

An operating method of a storage device includes reading data from a nonvolatile memory using first read parameters and second read parameters and collecting read histories associated with a plurality of read operations. First histories and second histories are determined from the collected read histories. The second read parameters are adjusted according to the first histories, and the first read parameters are adjusted according to the second histories. The read histories include information on read voltages used to perform the read operations, and the first histories and the second histories are determined from the collected read histories according to the number of read voltages having the same level.

21 Claims, 18 Drawing Sheets

(56) References Cited

U.S. PATENT DOCUMENTS

| | | |
|---|---|---|
| 2013/0080858 A1 | 3/2013 | Lee et al. |
| 2013/0179751 A1 | 7/2013 | Linstadt |
| 2013/0238955 A1 | 9/2013 | D'Abreu et al. |
| 2013/0258774 A1 | 10/2013 | Visconti et al. |
| 2013/0318422 A1 | 11/2013 | Weathers et al. |
| 2014/0164863 A1 | 6/2014 | Leem et al. |
| 2015/0085571 A1* | 3/2015 | Hu .................. G11C 16/26 365/185.03 |

* cited by examiner

FIG. 5

| ADDR | PT |
|---|---|
| ADDR_2 | T2 |
| ADDR_1 | T1 |
| ⋮ | ⋮ |
|  |  |

PTS1

| | G1 | G2 | G3 | G4 | G5 |
|---|---|---|---|---|---|
| | 0<TD≤TD1 | TD1<TD≤TD2 | TD2<TD≤TD3 | TD3<TD≤TD4 | TD4<TD |
| 1 | SN2 | | | | |
| 2 | SN1 | | | | |
| ⋮ | ⋮ | ⋮ | ⋮ | ⋮ | ⋮ |
| K | | | | | |

PTS2

FIG. 7

| P/E Cycle | | G1 | G2 | G3 | G4 | G5 |
|---|---|---|---|---|---|---|
| | | 0<TD≤TD1 | TD1<TD≤TD2 | TD2<TD≤TD3 | TD3<TD≤TD4 | TD4<TD |
| | 0<PE≤PE1 | SET00 | SET10 | SET20 | SET30 | SET40 |
| | PE1<PE≤PE2 | SET01 | SET11 | SET21 | SET31 | SET41 |
| | PE2<PE≤PE3 | SET02 | SET12 | SET22 | SET32 | SET42 |
| | PE3<PE≤PE4 | SET03 | SET13 | SET23 | SET33 | SET43 |
| | PE5<PE | SET04 | SET14 | SET24 | SET34 | SET44 |

Optional →

| P1 | P2 | P3 | P4 | P5 | P6 | P7 |
|---|---|---|---|---|---|---|
| -15 | -15 | -15 | -15 | -15 | -15 | -15 |

FIG. 9

| ADDR | PT |
|---|---|
| ADDR_2 | T1 → T1' |
| ADDR_1 | T1 |
| ⋮ | ⋮ |
|  |  |

PTS1 ↙ Minority History (points to T1 → T1' row)

| Minority History | G1 | G2 | G3 | G4 | G5 |
|---|---|---|---|---|---|
|  | $0 < TD \leq TD1$ | $TD1 < TD \leq TD2$ | $TD2 < TD \leq TD3$ | $TD3 < TD \leq TD4$ | $TD4 < TD$ |
| 1 | SN2 → | SN2 |  |  |  |
| 2 | SN1 |  |  |  |  |
| ⋮ | ⋮ | ⋮ | ⋮ | ⋮ | ⋮ |
| K |  |  |  |  |  |

PTS2

| Read Offset | Count |
|---|---|
| -10 | 5 |
| -15 | 6 |
| -20 | 4 |
| -25 | 1 |
| -30 | 1 |

← ② Adjacent → Selected
← ① Highest → Selected
← ③ Adjacent → Selected
← ④ Adjacent → Unselected

US 9,632,868 B2

STORAGE DEVICE INCLUDING NONVOLATILE MEMORY AND MEMORY CONTROLLER AND OPERATING METHOD OF STORAGE DEVICE

CROSS-REFERENCE TO RELATED APPLICATIONS

A claim for priority under 35 U.S.C. §119 is made to Korean Patent Application No. 10-2014-0076528 filed Jun. 23, 2014, in the Korean Intellectual Property Office, the entire contents of which are hereby incorporated by reference.

BACKGROUND

The application described herein relates to a semiconductor memory, and more particularly, relates to a storage device including a nonvolatile memory and a memory controller and an operating method of the storage device.

A storage device is a device that is adapted to store data according to the control of a host device, such as a computer, a smart phone, a smart pad, and so on. The storage device may contain a device (e.g., Hard Disk Drive), which stores data on a magnetic disk, or a semiconductor memory, such as Solid State Drive or memory card, in particular, a device which stores data on a nonvolatile memory.

A nonvolatile memory may be ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), or FRAM (Ferroelectric RAM).

The advancement of the semiconductor fabrication technology enables high integration and high capacity of the storage device, thereby making it possible to reduce production costs of the storage device. However, various problems that have not been found may arise as the storage device is scaled down due to its high integration. Such problems cause loss of data stored in the storage device, thereby resulting in a decrease in reliability of the storage device. Thus, there is required a device and a method capable of improving the reliability of the storage device.

SUMMARY

One aspect of embodiments of the application is directed to provide an operating method of a storage device which includes a nonvolatile memory and a memory controller configured to control the nonvolatile memory. The method comprises performing a plurality of read operations with respect to data of the nonvolatile memory using first read parameters and second read parameters and collecting read histories associated with the plurality of read operations. First histories and second histories are determined based on the collected read histories. The second read parameters are adjusted according to the first histories, and the first read parameters are adjusted according to the second histories. The read histories comprise information on read voltages used to perform the plurality of read operations, and the first histories and the second histories are determined from the collected read histories according to the number of read voltages having the same level.

In exemplary embodiments, the first read parameters include information on times when the data is respectively written at the nonvolatile memory.

In exemplary embodiments, the second read parameters contain information on read voltages according to a difference between a current time and a time when read-requested data is written at the nonvolatile memory.

In exemplary embodiments, the performing of a plurality of read operations with respect to data of the nonvolatile memory using first read parameters and second read parameters and collecting read histories associated with the plurality of read operations comprises receiving a read command; determining levels of read voltages using the first read parameters and the second read parameters; performing a read operation according to the levels of the read voltages thus determined; when an error of data read through the read operation gets out of a correction range, adjusting the levels of the read voltages and performing a read-retry operation; and when the read-retry operation succeeds, collecting, as a read history, a read offset by which the levels of the read voltages are adjusted.

In exemplary embodiments, the determining levels of read voltages using the first read parameters and the second read parameters comprises selecting the levels of the read voltages using the first and second read parameters, when a read history corresponding to the read command is not collected; and selecting the levels of the read voltages according to the first read parameters and the read history corresponding to the read command, when the read history corresponding to the read command is collected.

In exemplary embodiments, the determining first histories and second histories, based on the collected read histories comprises selecting a first read offset whose value is most common among read offsets of the collected read histories; further selecting a second read offset whose value is common among n read offsets of the collected read histories and the value of n is greater than a critical value, from among read offsets; and deciding read histories, corresponding to the selected first read offset and the selected second read offset, from among the collected read histories, as the first histories and the remaining read histories as the second histories.

In exemplary embodiments, the determining of first histories and second histories, based on the collected read histories comprises calculating an average and a distribution of the read offsets; selecting read histories, having read offsets within a critical distribution, from among the read histories as the first histories; and selecting read histories, having read offsets outside the critical distribution, from among the read histories as the second histories.

In exemplary embodiments, the determining of first histories and second histories, the adjusting of first read parameters, and adjusting second read parameters are performed whenever the number of collected read histories reaches a predetermined number.

In exemplary embodiments, the determining of first histories and second histories, the adjusting of first read parameters, and the adjusting of second read parameters are performed even though the number of the collected read histories is smaller than the predetermined number when the number of consecutively collected read histories with the same read offset reaches a critical value.

In exemplary embodiments, the determining of first histories and second histories, the adjusting of first read parameters, and adjusting second read parameters are performed whenever the number of consecutively collected read histories with the same read offset reaches a predetermined number.

In exemplary embodiments, a predetermined number of read histories are collected.

In exemplary embodiments, if the number of the collected read histories reaches a predetermined number, an earliest accessed read history of the collected read histories is discarded whenever a new read history is collected.

Another aspect of embodiments of the application is directed to provide a storage device comprising a nonvolatile memory; and a memory controller adapted to control the nonvolatile memory, wherein the memory controller comprises an ECC block adapted to correct an error of data read from the nonvolatile memory; a read manager adapted to control the nonvolatile memory such that a first read operation is performed using first read parameters and second read parameters and such that a second read operation is performed when a data error occurring with the first read operation is outside an error correction range of the ECC block, the read manager being further adapted to store information on read levels of the second read operation as a read history when the second read operation succeeds; and a voting unit adapted to update the first read parameters and the second read parameters using read histories collected by the read manager, and wherein the voting unit updates the second read parameters according to first histories of the collected read histories and updates the first read parameters according to second histories of the collected read histories.

In exemplary embodiments, the voting unit identifies read histories that have the read offset value that is most common among the read histories, as the first histories.

In exemplary embodiments, the nonvolatile memory includes a plurality of cell strings arranged on a substrate along rows and columns, and each cell string includes at least one ground selection transistor, a plurality of memory cells, and at least one string selection transistor sequentially stacked on the substrate in a direction perpendicular to the substrate.

With embodiments of the application, read parameters that are used to determine levels of read voltages according to a difference between a program time and a current time may be updated according to majority histories of read histories. Thus, representation of the read histories is improved, and the probability that a read error occurs is reduced. This may mean that the reliability of the storage device is improved.

Another aspect of embodiments of the application is directed to an operating method of a memory controller. The method includes receiving a request to read data from a nonvolatile memory and determining whether information of one or more previously successful read voltages associated with the data exists. A read operation of the data from the nonvolatile memory is performed using the information of the one or more previously successful read voltages associated with the data, if such information is determined to exist. A read operation of the data from the nonvolatile memory is performed using a read voltage identified in accordance with the difference between a current time for reading the data from the nonvolatile memory and a time associated with the writing of the data into the nonvolatile memory, if the information of the one or more previously successful read voltages associated with the data is determined not to exist.

In exemplary embodiments, the read voltage is further identified in accordance with an erase count for the memory cell storing the data to be read, if the information of the one or more previously successful read voltages associated with the data is determined not to exist.

In exemplary embodiments, the determination of whether the information of the one or more previously successful read voltages associated with the data exists is made by: identifying the difference between the current time for reading the data from the nonvolatile memory and the time associated with the writing of the data into the nonvolatile memory; and determining whether the information of the one or more previously successful read voltages exists for the identified time difference.

In exemplary embodiments, information corresponding to the read voltage used to perform each read operation associated with the data is stored in a read history file. Each read operation of the data from the nonvolatile memory is performed with a read voltage determined from a value obtained by a majority vote among stored values of the information corresponding to the read voltages used to perform read operations associated with the data, when enough such information exists within the read history file to conduct a majority vote. The majority vote determines the most common value stored in the read history file for the data.

In exemplary embodiments, the majority vote considers only the stored values that: are common to N or more read operations for the data in the read history file, where N is a predetermined positive integer, or fall within a predetermined distribution of the values for the data in the read history file.

In exemplary embodiments, the values considered by the majority vote are used to update the information of the one or more previously successful read voltages associated with the data.

In exemplary embodiments, information corresponding to the read voltage used to perform each read operation associated with the data is stored in a read history file. The number of consecutive times the same read voltage is used to perform a read operation associated with the data in the read history file is counted. When the count reaches a predetermined number, the information of the one or more previously successful read voltages associated with the data using the stored information corresponding to the read voltages used to perform read operations associated with the data in the read history file is updated.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 5 is a table showing first read parameters according to an embodiment of the application;

FIG. 7 is a table showing second read parameters according to an embodiment of the application;

FIG. 9 is a diagram schematically illustrating how first read parameters associated with minority histories are updated;

DETAILED DESCRIPTION

Figure 1:
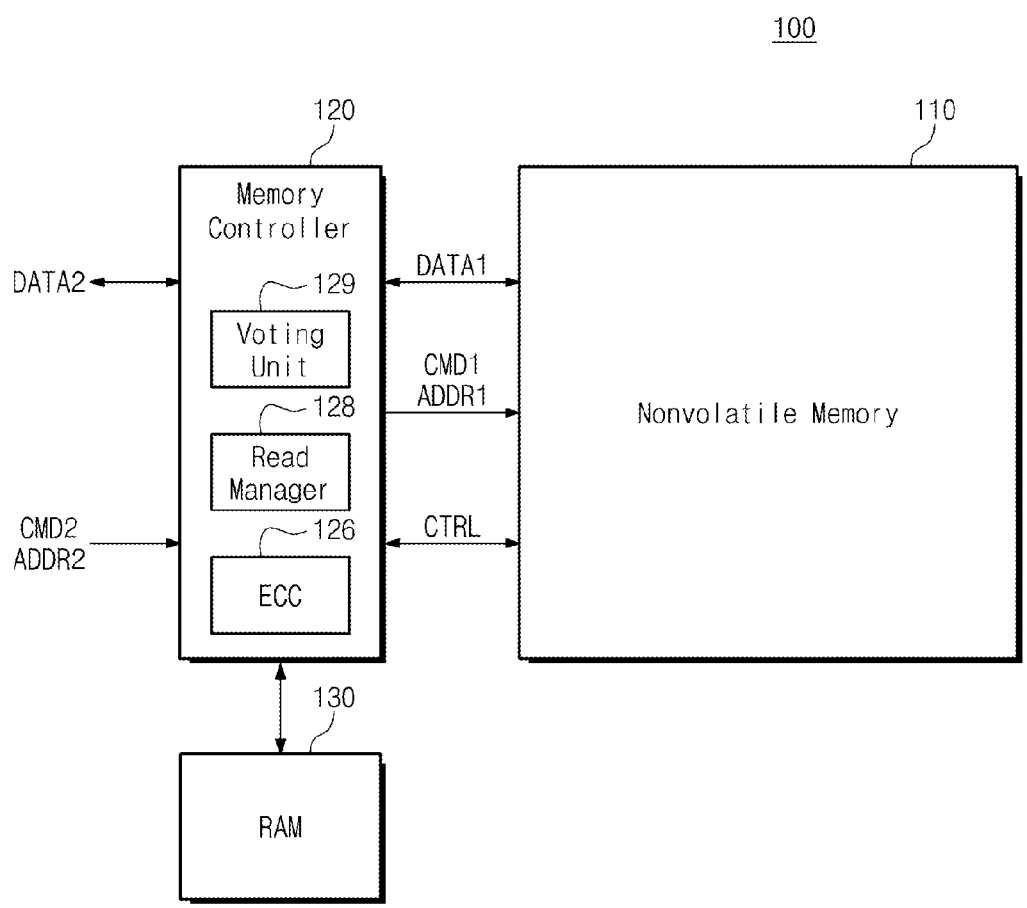
FIG. 1 is a block diagram schematically illustrating a storage device according to an embodiment of the application.

Embodiments will be described in detail with reference to the accompanying drawings. The technology, however, may be embodied in various different forms, and should not be construed as being limited only to the illustrated embodiments. Rather, these embodiments are provided as examples so that this disclosure will be thorough and complete, and will fully convey the concept of the application to those skilled in the art. Accordingly, known processes, elements, and techniques are not described with respect to some of the embodiments of the application. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the application.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the application. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 100 according to an embodiment of the application. Referring to FIG. 1, a storage device 100 contains a nonvolatile memory 110, a memory controller 120, and a RAM 130.

The nonvolatile memory 110 performs read, write, and erase operations according to a control of the memory controller 120. The nonvolatile memory 110 exchanges first data DATA1 with the memory controller 120. For example, the nonvolatile memory 110 receives first data DATA1 from the memory controller 120 and writes the first data DATA1. The nonvolatile memory 110 performs a read operation and outputs first data DATA1 thus read to the memory controller 120.

The nonvolatile memory 110 receives a first command CMD1 and a first address ADDR1 from the memory controller 120. The nonvolatile memory 110 exchanges a control signal CTRL with the memory controller 120. For example, the nonvolatile memory 110 receives, from the memory controller 120, at least one of a chip enable signal /CE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE received from the memory controller 120 at a read operation, periodically toggled, and used to tune timing, a write enable signal /WE activated by the memory controller 120 when the first command CMD1 or the first address ADDR1 is transmitted, a write protection signal /WP activated by the memory controller 120 to prevent unintended writing or erasing when power changes, and a data strobe signal DQS used to adjust input synchronization about the first data DATA1 and generated from the memory controller 120 at a write operation so as to be periodically toggled. For example, the nonvolatile memory 110 outputs to the memory controller 120 at least one of a ready/busy signal R/nB indicating whether the nonvolatile memory 110 is performing a program, erase or read operation, and a data strobe signal DQS used to adjust output synchronization about the first data DATA1 and generated from the read enable signal /RE by the nonvolatile memory 110 so as to be periodically toggled.

The nonvolatile memory 110 may include a flash memory. However, the application is not limited thereto. For example, the nonvolatile memory 110 may incorporate at least one of nonvolatile memories, such as PRAM (Phase-change RAM), MRAM (Magnetic RAM), RRAM (Resistive RAM), FeRAM (Ferroelectric RAM), and so on.

The memory controller 120 is configured to control the nonvolatile memory 110. For example, the memory controller 120 controls the nonvolatile memory 110 to perform a read, write, or erase operation. The memory controller 120 exchanges the first data DATA1 and the control signal CTRL with the nonvolatile memory 110, and it outputs the first command CMD1 and the first address ADDR1 to the nonvolatile memory 110.

The memory controller 120 controls the nonvolatile memory 110 according to a control of an external host device (not shown). The memory controller 120 exchanges second data DATA2 with the host device and receives a second command CMD2 and a second address ADDR2 therefrom.

In exemplary embodiments, the memory controller 120 exchanges the first data DATA1 with the nonvolatile memory 110 by a first unit, and it exchanges the second data DATA2 with the host device by a second unit different from the first unit.

Based on a first format, the memory controller 120 exchanges the first data DATA1 with the nonvolatile memory 110 and transmits the first command CMD1 and the first address ADDR1 to the nonvolatile memory 110. Based on a second format different from the first format, the memory controller 120 exchanges the second data DATA2 with the host device and receives the second command CMD2 and the second address ADDR2 from the host device.

The memory controller 120 uses the RAM 130 as a working memory, a buffer memory, or a cache memory. For example, the memory controller 120 receives the second data DATA2 from the host device and stores the second data DATA2 in the RAM 130. The memory controller 120 writes the second data DATA2 stored in the RAM 130 at the nonvolatile memory 110 as the first data DATA1. The memory controller 120 reads the first data DATA1 from the nonvolatile memory 110 and stores the first data DATA1 thus read in the RAM 130. The memory controller 120 outputs the first data DATA1 stored in the RAM 130 to the host device as the second data DATA2. The memory controller 120 stores data read from the nonvolatile memory 110 at the RAM 130 and writes the data stored in the RAM 130 back at the nonvolatile memory 110.

The memory controller 120 stores data or codes, needed to manage the nonvolatile memory 110, at the RAM 130. For example, the memory controller 120 reads data or codes, needed to manage the nonvolatile memory 110, from the nonvolatile memory 110 and loads the read data or codes on the RAM 130 for driving.

The RAM 130 may include at least one of a variety of random access memories, such as, but not limited to, a static RAM, a dynamic RAM, a synchronous DRAM (SRAM), a Phase-change RAM (PRAM), a Magnetic RAM (MRAM), a Resistive RAM (RRAM), a Ferroelectric RAM (FRAM), and so on.

The memory controller 120 contains an ECC block 126, a read manager 128, and a voting unit 129. The ECC block 126 generates parity: data used to correct an error of the first data DATA1 written at the nonvolatile memory 110. The parity the ECC block 126 produces is written at the nonvolatile memory 110 together with the first data DATA1. Also read is parity (or, data for error correction) associated with the first data DATA1 when the first data DATA1 is read from the nonvolatile memory 110. The ECC block 126 corrects an error of the first data DATA1 read from the nonvolatile memory 110, based on the parity read from the nonvolatile memory 110. The ECC block 126 may correct errors (e.g., 4-bit error) that are included in a predetermined range. If an error out of the predetermined range occurs at the first data DATA1 read from the nonvolatile memory 110, the error may not be corrected by the ECC block 126.

The read manager 128 controls a read operation of the nonvolatile memory 110. The read manager 128 controls the nonvolatile memory 110 such that a read operation is performed according to predetermined read parameters. For example, the read manager 128 may determine levels of read voltages, based on predetermined read parameters.

If an error of the first data DATA1 read from the nonvolatile memory gets out of a correction range, the read manager 128 controls a read retry operation of the nonvolatile memory 110. The read manager 128 adjusts levels of read voltages and controls the nonvolatile memory 110 to perform a read-retry operation. Also, the read manager 128 manages information on a read retry operation passed (succeeded) as a read history. For example, the read manager 128 manages information on levels of read voltages, which are used during the read-retry operation passed, as the read history.

The voting unit 129 updates read parameters, which the read manager 128 will refer to, using read histories managed by the read manager 128. For example, the voting unit 129 determines majority histories and minority histories of read histories through voting and adjusts read parameters according to the majority histories and minority histories. The majority histories may be histories in which the number of read voltages each having the same level as a read voltage of each of the majority histories is greater than a reference value (the number of read voltages, having the same level, from among read voltages of the majority histories is greater than a reference value). For example, when a read operation is performed, a set of read voltages is used. The set of read voltages are managed as a read history. When a plurality of read operations are performed, a plurality of sets of read voltages are collected. Among the plurality of read histories, a number of identical sets of read voltages is counted. If a number of identical sets of read voltages is greater than a number of other identical sets of read voltages, the identical sets of read voltages may correspond to the majority histories. The minority histories may be histories in which the number of read voltages each having the same level as a read voltage of each of the minority histories is smaller than the reference value (the number of read voltages, having the same level, from among read voltages of the minority histories is greater than the reference value). The other identical sets of read voltages may correspond to the minority histories. The majority histories and minority histories will be more fully described with reference to accompanying drawings.

The storage device 100 performs an operation of writing, reading or erasing data according to a request of the host device. The storage device 100 may include a solid state drive (SSD) or a hard disk drive (HDD). The storage device 100 may include memory cards, such as PC card (PCMCIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, universal flash storage (UFS), and so on. The storage device 100 may include embedded memories, such as eMMC (embedded MultiMedia Card), UFS, PPN (Perfect Page New), and so on.

Figure 2:
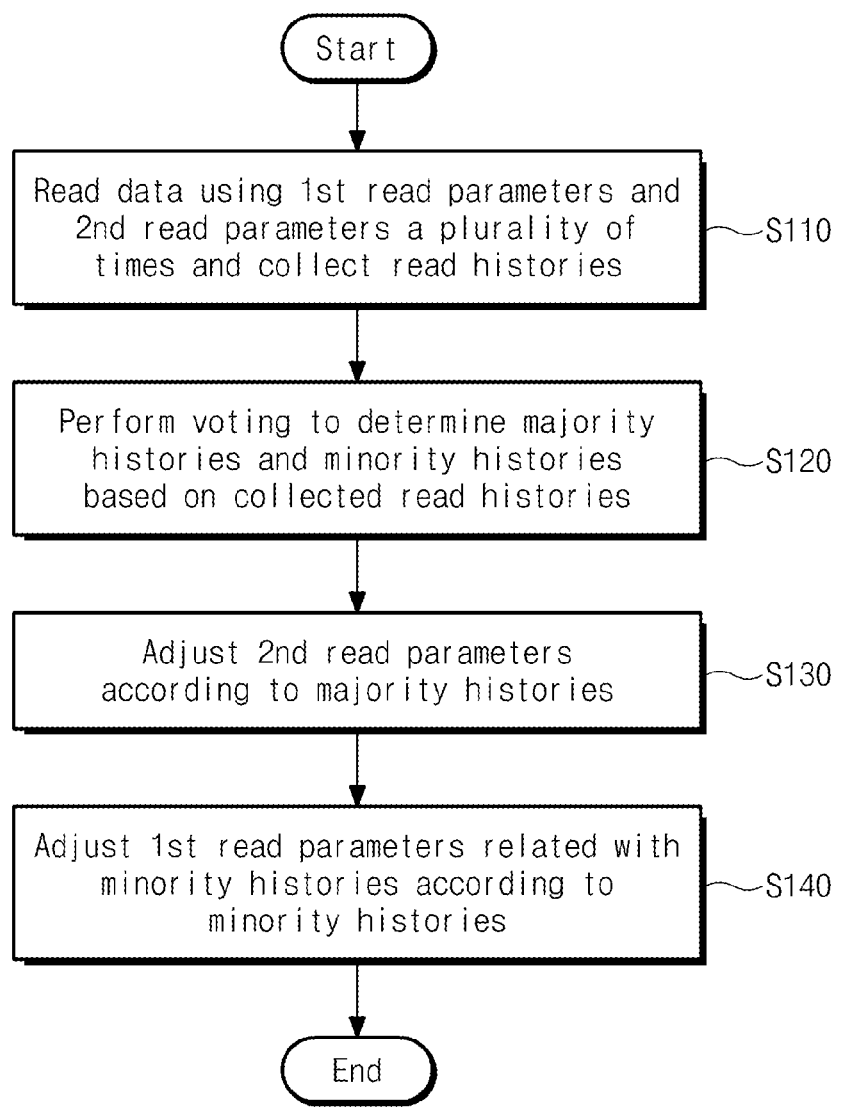
FIG. 2 is a flow chart schematically illustrating an operating method of a storage device according to an embodiment of the application.

FIG. 2 is a flow chart schematically illustrating an operating method of a storage device 100 according to an embodiment of the application. Referring to FIGS. 1 and 2, in step S110, data is read from a nonvolatile memory 110 using first read parameters and second read parameters a plurality of times, and read histories are collected. In step S120, voting is performed according to the collected histories to determine majority histories and minority histories. In step S130, the second read parameters are adjusted according to the majority histories. In step S140, the first read parameters associated with the minority histories are adjusted according to the minority histories. An operating method of FIG. 2 will be more fully described with reference to FIGS. 3 through 13.

Figure 3:
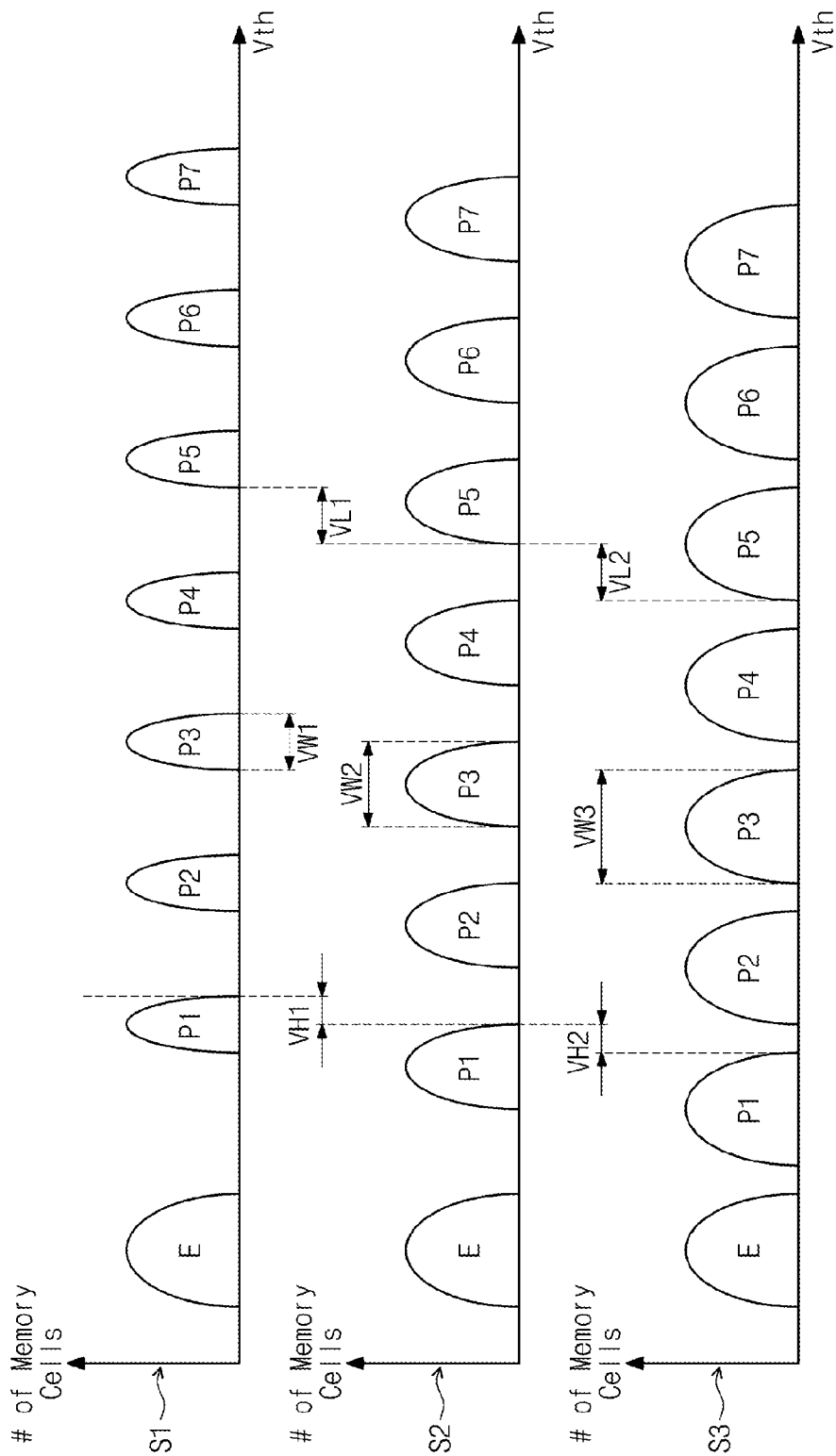
FIG. 3 is a diagram showing states of memory cells, at which data is written, from among memory cells of a nonvolatile memory.

FIG. 3 is a diagram showing states of memory cells, at which data is written, from among memory cells of a nonvolatile memory 110. In FIG. 3, the abscissa represents a threshold voltage of a memory cell, and the ordinate represents the number of memory cells. That is, FIG. 3 shows threshold voltage distributions of memory cells at which data is written.

A first state S1 shows threshold voltage distributions of memory cells just after data is written at memory cells. In exemplary embodiments, the memory cells may have an erase state E and first through seventh program states P1 through P7. Each of the erase state E and the first through seventh program states P1 through P7 may have a corresponding threshold voltage distribution range.

At a write operation, a threshold voltage of a write memory cell being a write target is adjusted to one of the erase state E and the first through seventh program states P1 through P7, based on data written at the write memory cell. For example, a threshold voltage of a memory cell may be adjusted such that it belongs to a threshold voltage distribution range of one of the erase state E and the first through seventh program states P1 through P7.

At a read operation, data written at a read memory cell being a read target is determined according to whether a threshold voltage of the read memory cell belongs to any one of the erase state E and the first through seventh program states P1 through P7. For example, data written at the read memory cell is determined according to whether a threshold voltage of the read memory cell belongs to a threshold voltage distribution range of any one of the erase state E and the first through seventh program states P1 through P7. For example, the erase state E and the first through seventh program states P1 through P7 may be determined using read voltages having levels among the erase state E and the first through seventh program states P1 through P7.

A second state S2 shows threshold voltage distributions of memory cells when a first time elapses after data is written at the memory cells. A third state S3 shows threshold voltage distributions of memory cells when a second time longer than the first time elapses after data is written at the memory cells.

Referring to the first program states P1 of the first through third states S1 through S3, if the first time elapses after data is written, the upper limit of a threshold voltage distribution range of each program state may decrease as great as a first voltage VH1. Also, if the second time elapses after data is written, the upper limit of a threshold voltage distribution range of each program state may decrease as great as a second voltage VH2 greater than the first voltage VH1. The second through seventh program states P2 through P7 may also experience the above-described phenomenon that the upper limit of a threshold voltage distribution range varies with the lapse of time (for example, decreases).

Referring to the third program states P3 of the first through third states S1 through S3, if the first time elapses after data is written, a width of a threshold voltage distribution range of each program state may increase from a first voltage distribution range width VW1 to a second voltage distribution range width VW2. Also, if the second time elapses after data is written, a width of a threshold voltage distribution range of each program state may increase from the second voltage distribution range width VW2 to a third voltage distribution range width VW3. The first, second, and fourth through seventh program states P1, P2, and P4 through P7 may also experience the above-described phenomenon that the width of a threshold voltage distribution range varies with the lapse of time (for example, increases).

Referring to the fifth program states P5 of the first through third states S1 through S3, if the first time elapses after data is written, the lower limit of a threshold voltage distribution range of each program state may decrease as great as a first voltage VL1. Also, if the second time elapses after data is written, the lower limit of a threshold voltage distribution range of each program state may decrease as great as a second voltage VL2 greater than the first voltage VL1. The first through fourth, sixth, and seventh program states P1 through P4, P6, and P7 may also experience the above-described phenomenon that the lower limit of a threshold voltage distribution range varies with the lapse of time (for example, decreases).

That is, if a time elapses after writing of data at memory cells, threshold voltages of memory cells may change. For example, if a time elapses after writing of data at memory cells, threshold voltages of memory cells may decrease and a distribution width may increase.

To compensate for a variation in threshold voltages of memory cells with lapse of time, as illustrated in step S110 shown in FIG. 2, a read manager 128 of a memory controller 120 adjusts read voltages using read parameters. Also, in case a read operation using the adjusted read voltages fails, the read manager 128 adjusts the read voltages to iteratively perform a read retry operation.

Figure 4:
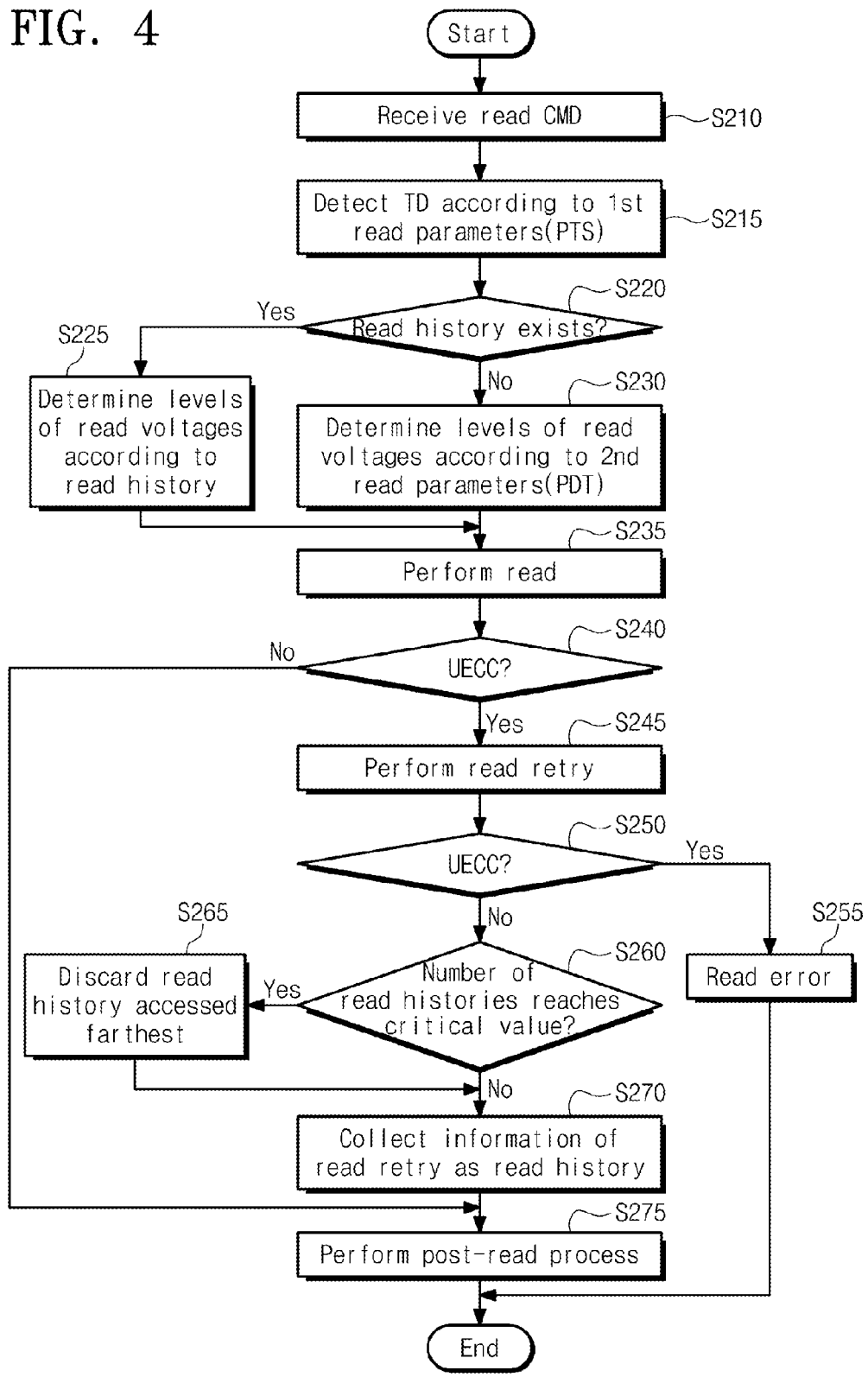
FIG. 4 is a detailed flow chart showing a method of performing a read operation using read parameters and collecting a read history.

FIG. 4 is a detailed flow chart showing a method (step S110 of FIG. 2) of performing a read operation using read parameters and collecting a read history. Referring to FIGS. 1 and 4, in step S210, a read command is received. For example, a memory controller 120 receives a read command as a second command CMD2 from an external host device. In other exemplary embodiments, even though a request is not received from the external host device, the memory controller 120 may internally generate a read command according to a predetermined schedule. A read manager 128 may receive the read command received from the external host device or the read command generated in the memory controller 120.

In step S215, a time difference TD is detected using first read parameters. The time difference TD indicates a time that elapses after read-requested data is written at a nonvolatile memory 110. In exemplary embodiments, the first read parameters may be a program time stamp (PTS).

The first read parameters are exemplarily illustrated in FIG. 5. Referring to FIG. 1 and a first program time stamp PTS1 of FIG. 5, the memory controller 120 manages an address ADDR and a program time of first data DATA1 written at the nonvolatile memory as a first program time stamp PTS1. Addresses ADDR_1 and ADDR_2 registered at the first program time stamp PTS1 may be a second address ADDR2 exchanged between the memory controller 120 and the external host device or a first address ADDR1 exchanged between the memory controller 120 and the nonvolatile memory 110. Program times T1 and T2 registered at the first program time stamp PTS1 may indicate an absolute time when first data DATA1 is written at the nonvolatile memory 110 or a relative time managed in the memory controller 120.

For example, when first data DATA1 is written at a storage space of the nonvolatile memory 110 corresponding to an address ADDR_1, the memory controller 120 registers the address ADDR_1 and the first time T1 when the first data DATA1 is written, at the first program time stamp PTS1. When first data DATA1 is written at a storage space of the nonvolatile memory 110 corresponding to an address ADDR_2, the memory controller 120 registers the address ADDR_2 and the first time T1 when the first data DATA1 is written, at the first program time stamp PTS1.

A read manager 128 detects the time difference TD using the first program time stamp PTS1. For example, the read manager 128 detects a program time PT from the first program time stamp PTS1, based on an address received together with a read command. The read manager 128 may detect a time difference TD between a current time and a program time PT. The detected time difference TD may indicate a time that elapses after data is written at a read memory cell being a read target.

Referring to FIG. 1 and a second program time stamp PTS2 of FIG. 5, the memory controller 120 manages a serial number SN corresponding to the first data DATA1 written at the nonvolatile memory 110, according to a time that elapses after the first data DATA1 is written at the nonvolatile memory 110.

For example, when first data DATA1 is written at a storage space of the nonvolatile memory 110 corresponding to an address ADDR_1, the memory controller 120 produces a first serial number SN1 from the address ADDR_1. The memory controller 120 registers the first serial number SN1 at a first group G1 of a second program time stamp PTS2.

The first serial number SN1 is managed in the first group G1 when a time that elapses after first data DATA1 corresponding to the first serial number SN1 is written at the nonvolatile memory 110, that is, the time difference TD is smaller than the first time difference TD1.

If the time difference TD corresponding to the first serial number SN1 becomes greater than the first time difference TD1, the first serial number SN1 may move into a second group G2 from the first group G1. When the time difference TD corresponding to the first serial number SN1 is greater than the first time difference TD1 and smaller than a second time difference TD2, the first serial number SN1 is managed in the second group G2.

If the time difference TD corresponding to the first serial number SN1 becomes greater than the second time difference TD2, the first serial number SN1 may move into a third group G3 from the second group G2. When the time difference TD corresponding to the first serial number SN1 is greater than the second time difference TD2 and smaller than a third time difference TD3, the first serial number SN1 is managed in the third group G3.

If the time difference TD corresponding to the first serial number SN1 becomes greater than a third time difference TD3, the first serial number SN1 may move into a fourth group G4 from the third group G3. When the time difference TD corresponding to the first serial number SN1 is greater than the third time difference TD3 and smaller than a fourth time difference TD4, the first serial number SN1 is managed in the fourth group G4.

If the time difference TD corresponding to the first serial number SN1 becomes greater than the fourth time difference TD4, the first serial number SN1 may move into a fifth group G5 from the fourth group G4. Afterwards, the first serial number SN1 is managed in the fifth group G5.

Likewise, when first data DATA1 is written at a storage space of the nonvolatile memory 110 corresponding to an address ADDR_2, the memory controller 120 produces a second serial number SN2 from the address ADDR_2. The memory controller 120 manages the second serial number SN2 in the same manner as the first serial number SN1.

If a read command is received, the read manager 128 produces a serial number SN from an address corresponding to the read command. The read manager 128 searches serial numbers from the second program time stamp PTS2. The read manager 128 detects a time difference TD corresponding to the read-requested data, based on a range of a time difference TD of a group to which the searched serial number belongs. For example, the read manager 128 may detect, as a time difference TD, the upper limit or the lower limit of a time difference TD of a group to which the searched serial number belongs, or any value (e.g., an average value) in its range.

In exemplary embodiments, groups of time differences TD of the second program time stamp PTS2 may be set by a logarithmic scale. The second time difference TD2 may be K times the first time difference TD1. The third time difference TD3 may be K times the second time difference TD1, and the fourth time difference TD4 may be K times the third time difference TD3.

In FIG. 5, an embodiment of the application is exemplified as a time difference TD is divided into five sections for management of a serial number SN. However, the application is not limited thereto.

Returning to FIGS. 1 and 4, in step S220, whether a read history exists is determined. For example, the read manager 128 determines whether a read history relating to the received read command is collected. The read manager 128 determines whether a read history relating to the received read command is collected, based on a time difference TD detected from the first read parameters. The read history may contain information on levels of read voltages used to determine an erase state E and first through seventh program states P1 through P7 of memory cells at a read operation.

If a read history relating a read command is collected, in step S225, the read manager 128 may determine levels of read voltages according to the read history. Read histories that the read manager 128 manages are exemplarily illustrated in FIG. 6.

Figure 6:
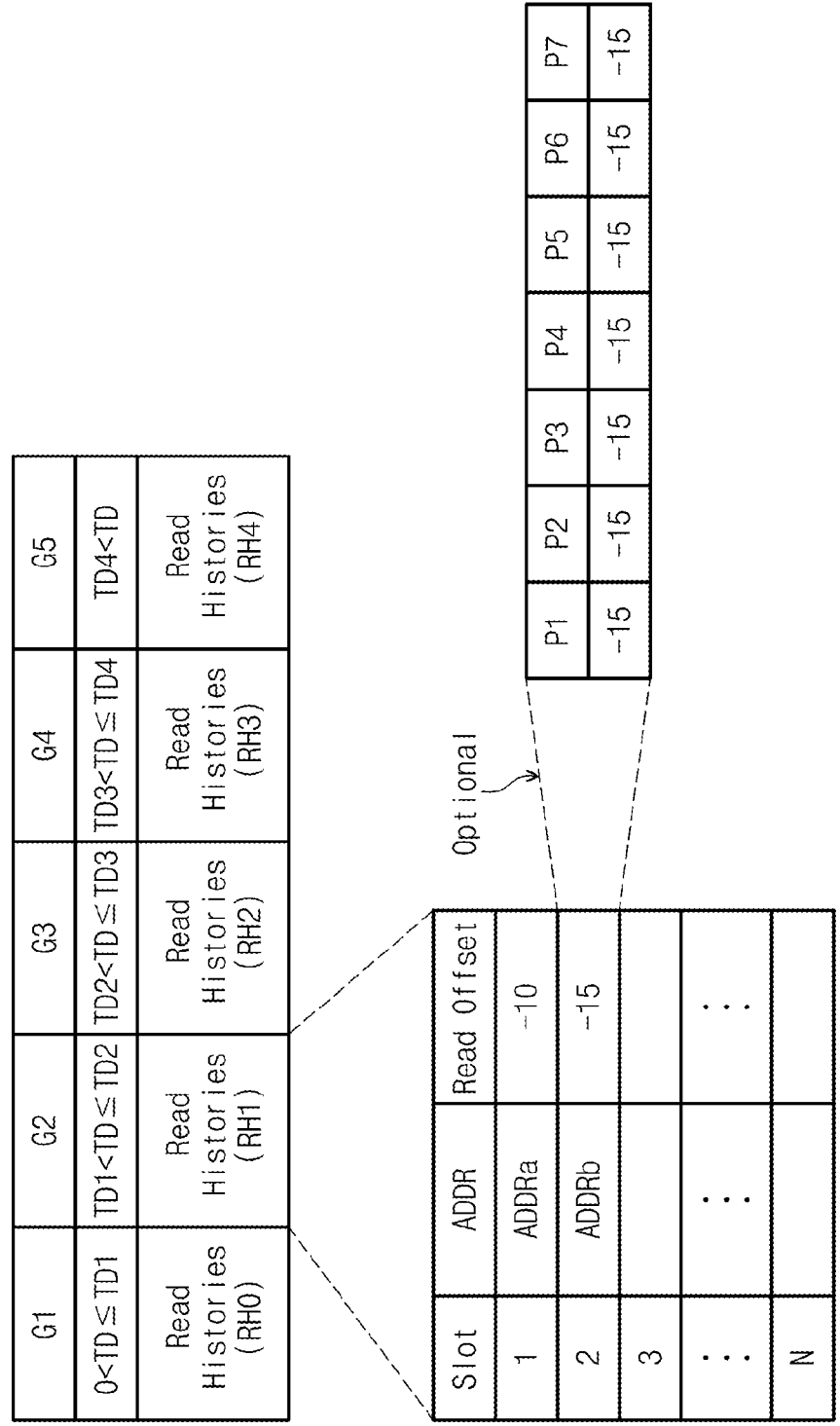
FIG. 6 is a table showing read histories according to an embodiment of the application.

Referring to FIGS. 1 and 6, the read manager 128 divides and manages read histories into a plurality of groups G1 through G5 according to the time difference TD.

For example, the read manager 128 manages information on operations (e.g., read-retry operations) of reading data (or, memory cells where data is written) of which the time difference TD is equal to or smaller than a first time difference TD1, as read histories RH0 of the first group G1. The read manager 128 manages information on operations (e.g., read-retry operations) of reading data (or, memory cells where data is written), of which the time difference TD is greater than the first time difference TD1 and equal to or smaller than a second time difference TD2, as read histories RH1 of the second group G2. The read manager 128 manages information on operations (e.g., read-retry operations) of reading data (or, memory cells where data is written) of which the time difference TD is greater than the second time difference TD2 and equal to or smaller than a third time difference TD3, as read histories RH2 of the third group G3. The read manager 128 manages information on operations (e.g., read-retry operations) of reading data (or, memory cells where data is written) of which the time difference TD is greater than the third time difference TD3 and equal to or smaller than a fourth time difference TD4, as read histories RH3 of the fourth group G4. The read manager 128 manages information on operations (e.g., read-retry operations) of reading data (or, memory cells where data is written) of which the time difference TD is greater than the fourth time difference TD4, as read histories RH4 of the fifth group G5.

The read manager 128 selects read histories of one of the plurality of groups G1 through G5, based on the time difference TD of read-requested data (or, memory cells where data is written). FIG. 6 shows how read histories of the second group G2 are managed.

Read histories RH1 may be managed using a queue with a predetermined size. For example, the size of the queue may be N.

An address ADDRa and a read offset (−10) associated with the address ADDRa are registered at a first slot. The address ADDRa may be an address of read-requested data. The address ADDRa may be a second address ADDR2 exchanged between an external host device and the memory controller 120 or a first address ADDR1 exchanged between the memory controller 120 and the nonvolatile memory 110. The read offset (−10) may indicate how much levels of read voltages are adjusted at reading of read-requested data. The read offset (−10) may indicate how much levels of read voltages, when a read operation (e.g., a read-retry operation) succeeds, are adjusted from default levels (or levels of a PDT explained below) of read voltages of the nonvolatile memory 110. That is, a read history, stored in the first slot, from among the read histories may contain information on the read offset (−10) by which levels of read voltages are adjusted when first data DATA1 corresponding to the address ADDRa is successfully read.

Likewise, a read history, stored in a second slot, from among the read histories may contain information on the read offset (−15) by which levels of read voltages are adjusted when first data DATA1 corresponding to an address ADDRb is successfully read.

In exemplary embodiments, a common read offset may be registered with respect to a plurality of read voltages used to determine an erase state E1 and a plurality of first through seventh program states P1 through P7. In other exemplary embodiments, common read offsets may be registered with respect to a plurality of read voltages used to determine an erase state E1 and a plurality of first through seventh program states P1 through P7, respectively.

As described with reference to FIGS. 1 and 6, read histories include information on a read offset when a read operation (e.g., a read-retry operation) succeeds. In case a read command is received, the read manager 128 determines whether a read history associated with the received read command exists. For example, the read manager 128 selects a read history group using a time difference TD and determines whether the same address exists in a queue where read histories are stored, based on a read address received together with the read command. That the same address exists may indicate that a read history associated with a received read command exists.

A read history contains information on a read offset when a read operation succeeds. If a read operation is performed using a read offset of a read history, the probability that a read operation succeeds may increase as compared with when a read operation is performed using read voltages adjusted according to statistic and prediction. Thus, the read manager 128 adjusts levels of read voltages using a read history.

In FIG. 6, an embodiment of the application is exemplified as a time difference TD is divided into five sections, that is, four read histories RF0 through RF4 are managed. However, the application is not limited thereto. For example, the number of time difference groups G1 through G5 for management of read histories RF0 through RF4 is equal to the number of time difference groups G1 through G5 of a second program time stamp PTS2.

Returning to FIGS. 1 and 4, in case a read history associated with a read command is not collected, in step S230, the read manager 128 determines levels of read voltages according to second read parameters. For example, the read manager 128 determines levels of read voltages according to statistic or prediction, using both the second read parameters and a time difference TD that is detected on the basis of the first read parameters.

The second read parameters contain the time difference TD and information on levels of read voltages according to the number of program-erase cycles PE of read memory cells being a read target. The second read parameters may be a predefined table PDT.

The second read parameters are exemplarily illustrated in FIG. 7. Referring to FIGS. 1 and 7, the second read parameters contain information on a plurality of sets SET00 through SET44. The read manager 128 divides and manages the plurality of sets SET00 through SET44 into a plurality of groups G1 through G5 according to a time difference TD corresponding to read request data. The read manager 128 selects one of the plurality of sets SET00 through SET44, based on a time difference TD detected from the first read parameters and the number of program-erase cycles PE.

If the time difference TD is equal to or smaller than a first time difference TD1, the read manager 128 may select one of sets SET00 through SET04 of the first group G1. In case the time difference TD is greater than the first time difference TD1 and equal to or smaller than a second time difference TD2, the read manager 128 selects one of sets SET10 through SET14 of the second group G2. When the time difference TD is greater than the second time difference TD2 and equal to or smaller than a third time difference TD3, the read manager 128 selects one of sets SET20 through SET24 of the third group G3. If the time difference TD is greater than the third time difference TD3 and equal to or smaller than a fourth time difference TD4, the read manager 128 may select one of sets SET30 through SET34 of the fourth group G4. When the time difference TD is greater than the fourth time difference TD4, the read manager 128 selects one of sets SET40 through SET44 of the fifth group G5.

In FIG. 7, an embodiment of the application is exemplified as sets SET00 through SET44 are divided into five groups G1 through G5 according to a time difference TD. However, the application is not limited thereto. For example, the number of groups G1 through G5 for management of the plurality of sets SET00 through SET44 is equal to the number of time difference groups G1 through G5 of a second program time stamp PTS2.

An erase count PE may indicate the number of erase operations (or, program and erase operations) performed with respect to a memory cell being a read target. When the erase count PE is equal to or smaller than a first erase count PE1, the read manager 128 selects one of sets SET00 through SET40. When the erase count PE is greater than the first erase count PE1 and equal to or smaller than a second erase count PE2, the read manager 128 selects one of sets SET01 through SET41. If the erase count PE is greater than the second erase count PE2 and equal to or smaller than a third erase count PE3, the read manager 128 may select one of sets SET02 through SET42. In case the erase count PE is greater than the third erase count PE3 and equal to or smaller than a fourth erase count PE4, the read manager 128 may select one of sets SET03 through SET43. The read manager 128 selects one of sets SET04 through SET44 when the erase count PE is greater than the fourth erase count PE4, which is identified as PE5 in FIG. 7.

In FIG. 7, an embodiment of the application is exemplified as an erase count PE is divided into five sections and one of a plurality of sets SET00 through SET44 is selected. However, the application is not limited thereto.

Each of the plurality of sets SET00 through SET44 contains information on a read offset. A read offset of each set may indicate how much levels of read voltages are adjusted from default levels of read voltages of the nonvolatile memory 110.

In exemplary embodiments, a common read offset may be registered with respect to a plurality of read voltages used to determine an erase state E1 and a plurality of first through seventh program states P1 through P7. In other exemplary embodiments, common read offsets may be registered with respect to a plurality of read voltages used to determine an erase state E1 and a plurality of first through seventh program states P1 through P7, respectively.

As described with reference to FIGS. 1 and 7, in case no read history exists, the read manager 128 selects one of the sets SET00 through SET44 from the second read parameters, using a time difference TD and an erase count PE. The read manager 128 determines levels of read voltages using a read offset (or, read offsets) of the selected set.

Returning to FIGS. 1 and 4, in step S235, a read operation is performed. The read manager 128 performs a read operation, based on read voltages adjusted using a read history or read voltages adjusted using the second read parameters. An ECC block 126 may perform an error correction operation when a read operation is performed.

In case errors are corrected by the ECC block 126 (step S240), in step S275, an operation following the read operation is processed. For example, read data may be stored in a RAM 130. Read data may be output to an external host device as second data DATA2. Read data may be written back at the nonvolatile memory 110 as first data DATA1. Read data may be used in the memory controller 120.

In case errors get out of a correction range of the ECC block 126, that is, if error correction of the ECC block 126 is impossible, the method proceeds to step S245.

In step S245, the read manager 128 controls the nonvolatile memory 110 such that a read-retry operation is performed. For example, the read manager 128 adjusts levels of read voltages and controls the nonvolatile memory 110 to perform a read operation in a plurality of times.

The read manager 128 readjusts levels of read voltages, based on results of the plurality of read operations. The read manager 128 performs a read-retry operation using the readjusted read voltages. When the read-retry operation is performed, error correction may be made by the ECC block 126.

In case errors of data read through the read-retry operation are not corrected by the ECC block 126 (S250), in step S255, a read error may be determined. The memory controller 120 performs a post-read process according to the read error. For example, the memory controller 120 informs the external host device that the read error occurs. The memory controller 120 may perform a following operation for restoring data where the read error occurs.

In case errors of data read through the read-retry operation are corrected by the ECC block 126 (S250), the method proceeds to step S260. In step S260, whether the number of read histories reaches a critical value is determined. For example, the read manager 128 determines whether read histories are stored at all slots of a queue for storing read histories corresponding to time differences associated with read-requested data. That is, the read manager 128 determines whether the number of read histories reaches the number of slots of the queue.

As a consequence of determining that the number of read histories reaches a critical value, in step S265, an earliest accessed read history is discarded. An access to a read history may include collecting, referring to, and updating read histories.

As a consequence of determining that the number of read histories has not reached a critical value, or after at least one read history is discarded in step S265, the method proceeds to step S270. In step S270, information on a read-retry operation is collected as a read history. For example, information on the read-retry operation may be added to read histories corresponding to a time difference TD associated with read-requested data. In step S275, a post-read operation may be performed.

As described with reference to FIG. 4, the read manager 128 performs a read operation using first and second read parameters. When a read operation fails, the read manager 128 adjusts levels of read voltages and performs a read-retry operation. If the read-retry operation succeeds, information on the read-retry operation may be collected as a read history.

The read-retry operation is performed when a read operation using the first and second read parameters fails. That is, to perform the read-retry operation may be viewed as the degree of accuracy of read voltages according to the first and second read parameters is low. Thus, a storage device 100 according to an embodiment of the application is configured to correct the first and second read parameters using read histories. In particular, a voting unit 129 selects majority histories and minority histories of read histories through voting. The voting unit 129 corrects the second read parameters using the majority histories and the first read parameters using the minority histories.

Figure 8:
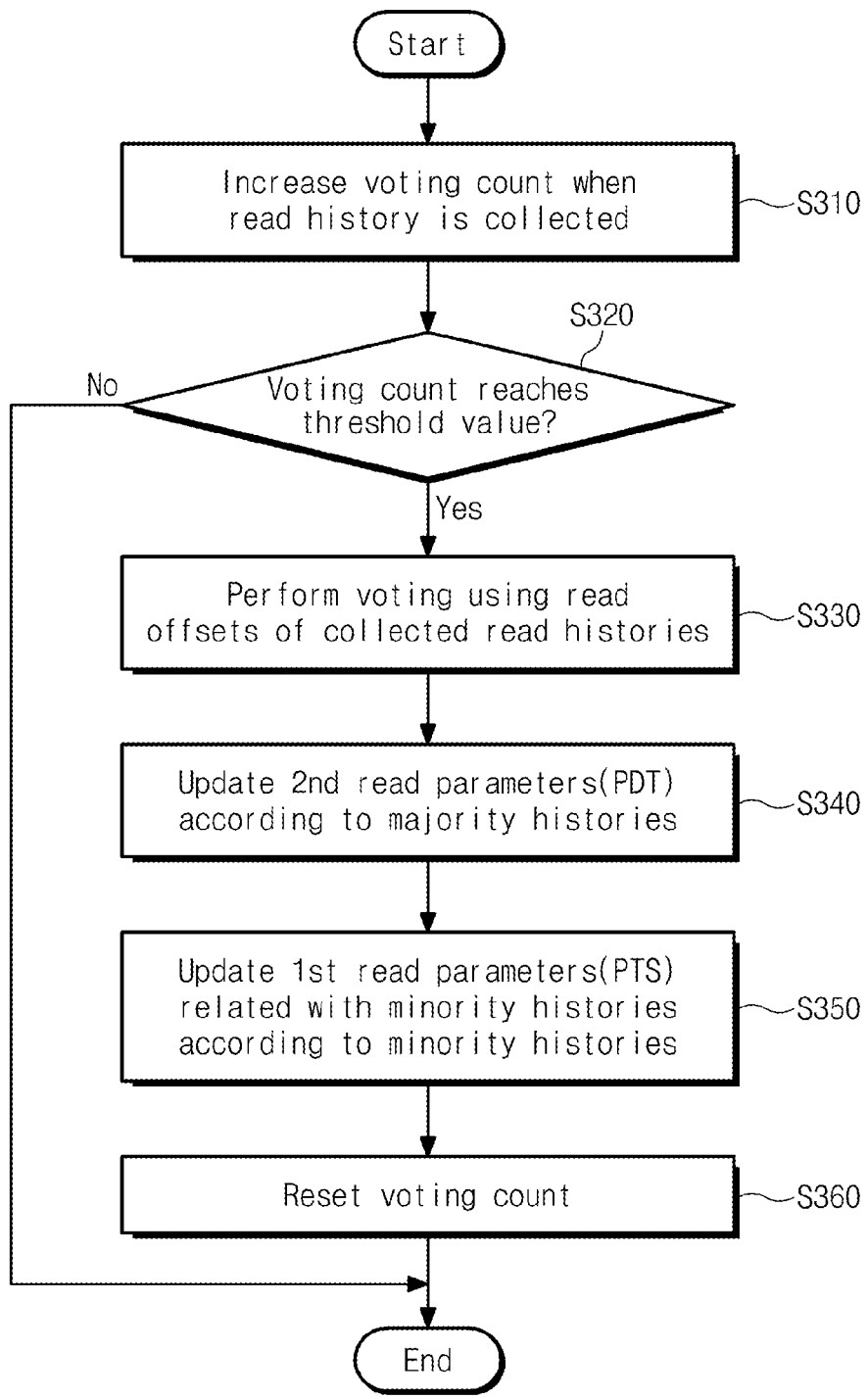
FIG. 8 is a flow chart for describing steps of the storage device performing voting using a read history and updating first and second read parameters using majority histories and minority histories, according to an embodiment of the application.

FIG. 8 is a flow chart for describing steps of the storage device 100 performing voting using a read history (S120) and updating first and second read parameters using majority histories and minority histories (S130 and S140), according to an embodiment of the application. Referring to FIGS. 1 and 8, in step S310, a voting count increases whenever a read history is collected.

For example, different voting counts may be managed according to a time difference TD of read-requested data. As described with reference to FIG. 6, for example, a voting unit 129 may manage a voting count corresponding to read histories RH0 of a first group G1, a voting count corresponding to read histories RH1 of a second group G2, a voting count corresponding to read histories RH2 of a third group G3, a voting count corresponding to read histories RH3 of a fourth group G4, and a voting count corresponding to read histories RH4 of a fifth group G5, respectively.

The voting unit 129 increases a voting count corresponding to read histories registered at the collected read history of the read histories RH0 through RH4, based on whether the collected read history is registered at any ones of the read histories RH0 through RH4.

Determined is whether a voting count reaches a critical value, in step S320. For example, the voting unit 129 may determine whether a voting count increased in step S310 reaches a critical value. In exemplary embodiments, the critical value may be a value that is equal to or smaller than N being the number of slots of a queue for storing read histories. If a voting count does not reach a critical value, that is, if read histories of which the number corresponding to a critical value are not collected, voting may not be performed. If a voting count reaches a critical value, that is, if read histories of which the number corresponding to a critical value are collected, the method proceeds to step S330.

In step S330, voting is performed using read offsets of the collected read histories. If the voting is performed, majority histories and minority histories may be determined. The voting will be more fully described with reference to FIGS. 10 through 12.

In step S340, second read parameters are updated according to the majority histories.

In step S350, first read parameters associated with the minority histories are updated according to the minority histories. In step S360, the voting count is reset.

As described with reference to FIG. 4, a time difference TD of the read-requested data is detected on the basis of the first read parameters (S215). Afterwards, levels of read voltages are adjusted using the detected time difference TD and the second read parameters (S230), and a read operation is performed (S235). As described with reference to FIG. 6, read histories RH0 through RH4 are separately managed according to sections of the time difference TD. Thus, read histories that the voting is performed with respect to may belong to the same section of sections of the time difference TD. The voting may be performed using read histories belonging to the same section of the time difference TD.

Management techniques such as wear leveling make memory cells of a nonvolatile memory 110 have similar erase counts PE. Thus, read histories that the voting is performed with respect to may be viewed as belonging to the same section of sections of the erase count PE. The voting may be performed using read histories belonging to the same section of the erase count PE.

That is, read histories that the voting is performed with respect to may be information on a read operation (e.g., a read-retry operation) performed using one of a plurality of sets SET00 through SET44 that is described with reference to FIG. 7. The voting is performed using read histories based on one set of the plurality of sets SET00 through SET44.

The majority histories may be viewed as a dominant characteristic of data that corresponds to both a time difference TD and an erase count PE associated with a selected set for the voting. Thus, if the above-described set is corrected on the basis of the majority histories, the chance that a read operation, which refers to the selected set based on majority data (or, memory cells at which data is written) corresponding to both a time difference TD and an erase count PE associated with the selected set, will succeed may increase. For example, an average or a weighted average of read offsets of the majority histories may be used for a read offset of the selected set (or, sets).

The minority histories may be viewed as an exceptional characteristic of data that corresponds to both a time difference TD and an erase count PE associated with the selected set. Thus, if the selected set is corrected on the basis of the minority histories, the chance that a read operation, which refers the selected set based on majority data (or, memory cells at which data is written) corresponding to both a time difference TD and an erase count PE associated with the selected set, will succeed may decrease.

When the second read parameters are corrected, the voting unit 129 according to an embodiment of the application applies the majority histories and excludes the minority histories, thereby improving the degree of accuracy of read offsets of the second read parameters and the reliability of a storage device 100.

The voting unit 129 according to an embodiment of the application is configured to compensate for an exceptional characteristic of data (or, memory cells at which data is written) associated with the minority histories, by correcting the first read parameters associated with the minority histories according to the minority histories. How the first read parameters associated with the minority histories are updated is illustrated in FIG. 9.

Referring to FIG. 1 and a first program time stamp PTS1 of FIG. 9, the voting unit 129 adjusts a program time stamp PTS1 associated with minority histories. In exemplary embodiments, data (or, memory cells at which data is written) associated with an address ADDR_1 may correspond to a minority history. Under a control of the voting unit 129, the program time PT corresponding to the address ADDR_2 may be updated from T1 to T1'.

In exemplary embodiments, when the program time PT is T1, a time difference TD of data (or, memory cells at which data is written) associated with the address ADDR_2 may be greater than a first time difference TD1 and smaller than a second time difference TD2. In this case, levels of read voltages of data (or, memory cells at which data is written) associated with the address ADDR_2 may be adjusted by one of sets SET10 through SET14 (refer to FIG. 7). For example, level of read voltages may be adjusted by a set SET11 according to an erase count PE.

A read-retry operation can succeed after a read operation according to the selected set SET11 fails. If information of the read-retry operation passed is collected as a read history, the read history may be decided as a minority history.

Read offsets of the minority history may not be applied to the selected set SET11. Instead, the voting unit 129 may apply read offsets of the minority history to a program time stamp PTS of the minority history.

For example, the voting unit 129 compares a read offset (or, read offsets) of the minority history with a read offset (or, read offsets) of the remaining sets (e.g., SET01, SET21, SET31, and SET41) other than the selected set SET11. As a comparison result, a read offset (or, read offsets) of the minority history may be similar to a read offset (or, read offsets) of another set SET21 rather than a read offset (or, read offsets) of the selected set SET11.

In this case, under a control of the voting unit 129, a program time stamp associated with the minority history may be updated from T1 to T1' such that a time difference TD is detected as belonging to a section of another set SET21, not a section of the selected set SET11, when there is detected a time difference TD of data (or, memory cells at which data is written) associated with the minority history.

Afterwards, levels of read voltages may be adjusted using not the selected set SET11 but another set SET21 when there is detected a time difference TD of data (or, memory cells at which data is written) associated with the minority history. Thus, the probability that a read operation on data (or, memory cells at which data is written) associated with the minority history succeeds may increase, and the reliability of the storage device 100 may be improved.

As another example, referring to FIG. 1 and a second program time stamp PTS2 of FIG. 9, a serial number SN2 corresponding to data associated with the minority history moves into another group G2 of the time difference TD. That is, now that a time difference TD of data associated with the minority history is adjusted, levels of read voltages associated with the minority history may be adjusted.

As described above, the storage device according to an embodiment of the application updates the second read parameters according to dominant characteristics of read histories. Thus, all adjusted parameters are read levels according to dominant characteristics of read histories. The storage device 100 according to an embodiment of the application updates the first read parameters corresponding to exceptional characteristics, according to exceptional characteristics of read histories. Improved is the reliability of the storage device 100 because read levels corresponding to the exceptional characteristics are adjusted according to the exceptional characteristics of the read histories.

Figure 10:
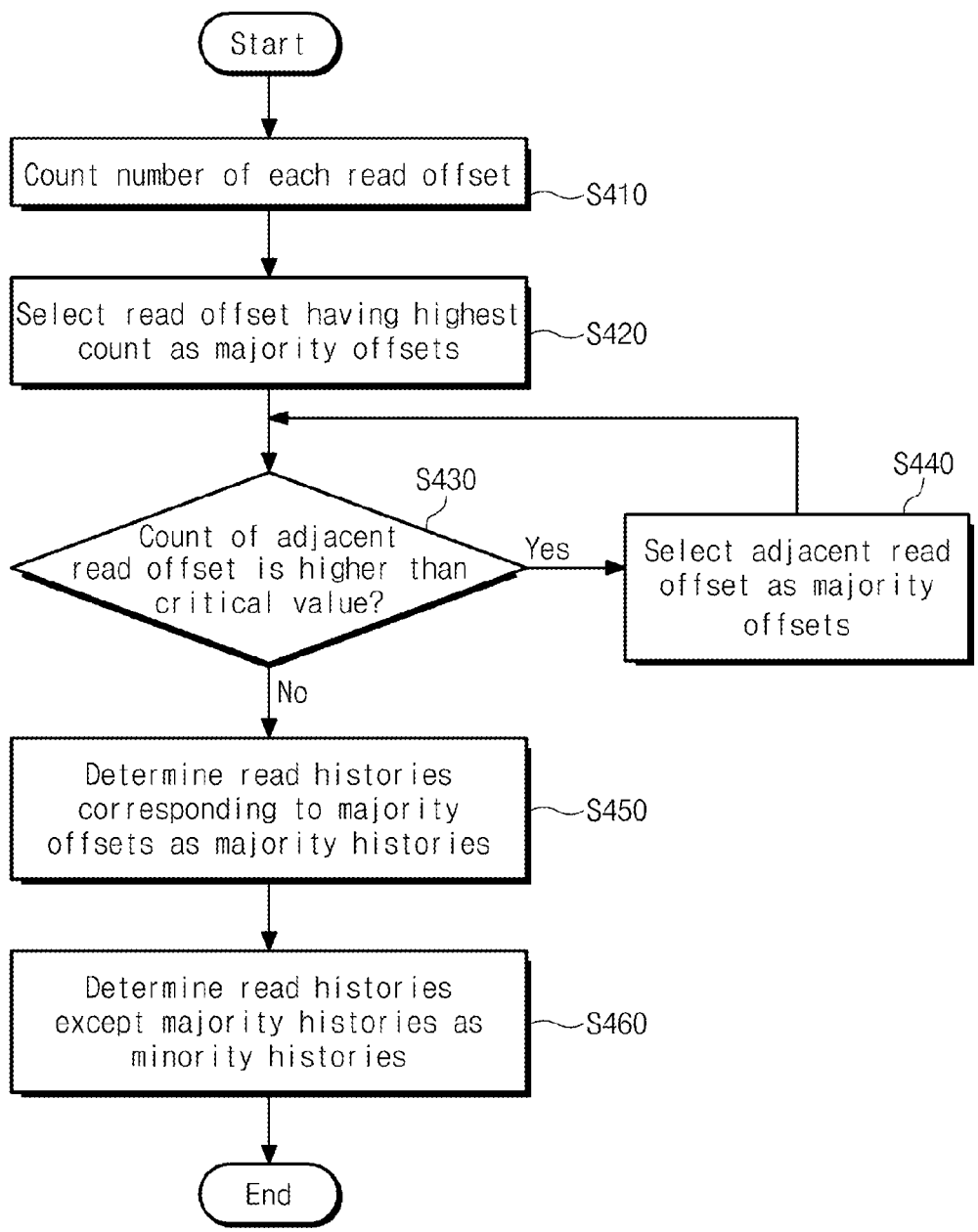
FIG. 10 is a flow chart schematically illustrating a voting method according to an embodiment of the application.
Figures 11, 12:
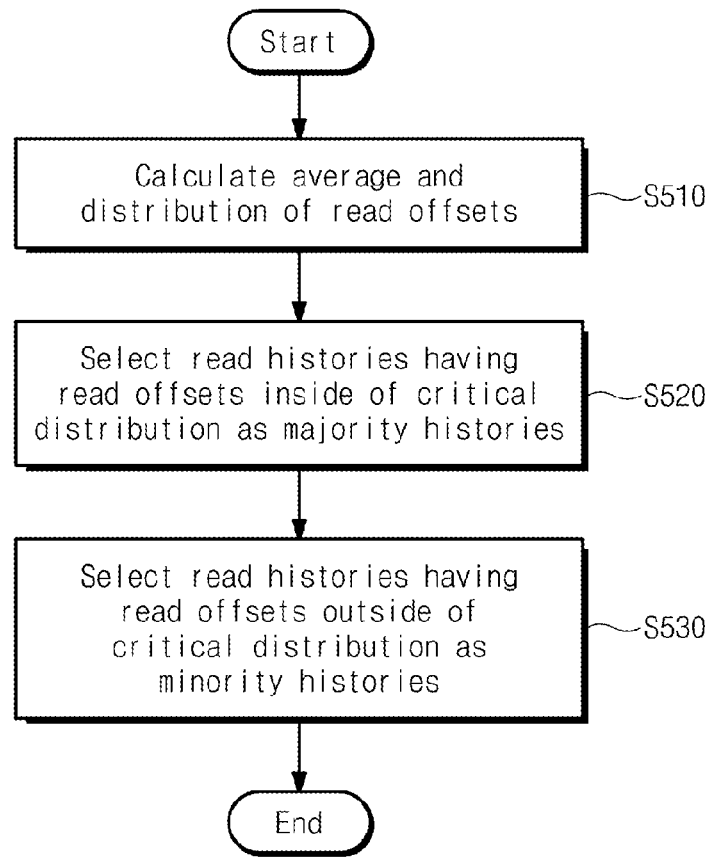
FIG. 11 shows how voting is performed.
FIG. 12 is a flow chart schematically illustrating a voting method according to another embodiment of the application.

FIG. 10 is a flow chart schematically illustrating a voting method according to an embodiment of the application. FIG. 11 shows how voting is performed. Referring to FIGS. 1, 10, and 11, in step S410, each read offset of read histories is counted. For example, the same read offsets of read offsets of the read histories may be counted.

For example, five read histories of read histories may have a read offset of −10. In this case, a count corresponding to a read offset of −10 may be 5. Likewise, read offsets of −15, read offsets of −20, read offsets of −25, and read offsets of −30 may be counted, respectively.

In step S420, a read offset with the highest count is selected as one of the majority offsets. For example, there may be selected a read offset that has the highest count and has a count greater than a critical value. For example, the critical value may have an amount that is decided according to a critical value of a voting count. The critical value may be set to a value that is obtained by dividing a critical value of the voting count by n (n being a positive number). In exemplary embodiments, the critical value may be 3. As illustrated in FIG. 11, a read offset of −15 may have the greatest count of 6. Thus, the read offset of −15 is selected as one of the majority offsets.

Determined, in step S430, is whether a count of an adjacent read offset is higher than the critical value. If a count of a read offset adjacent to the selected read offset is greater than the critical value, in step S440, the adjacent read offset may be selected as one of the majority offsets. Steps S430 and S440 are iterated until a count of the adjacent read offset is not greater than the critical value.

As illustrated in FIG. 11, a count of a read offset (−10) adjacent to a selected read offset (−15) is 5 and is greater than the critical value. Thus, the read offset of −10 is selected as one of the majority offsets.

A count of a read offset (−20) adjacent to a selected read offset (−15) is 4 and is greater than the critical value. Thus, the read offset of −20 is selected as one of the majority offsets.

A count of a read offset (−25) adjacent to a selected read offset (−20) is 1 and is smaller than the critical value. Thus, the read offset of −25 is not selected as one of the majority offsets.

In step S450, read histories corresponding to the majority offsets are determined as majority histories.

In step S460, read histories other than majority histories are determined as minority histories.

FIG. 12 is a flow chart schematically illustrating a voting method according to another embodiment of the application. Referring to FIGS. 1 and 12, in step S510, an average and a distribution of read offsets of read histories are calculated.

In step S520, read histories having read offsets within a critical distribution are selected as majority histories.

In step S530, read histories having read offsets outside the critical distribution are selected as minority histories.

Figure 13:
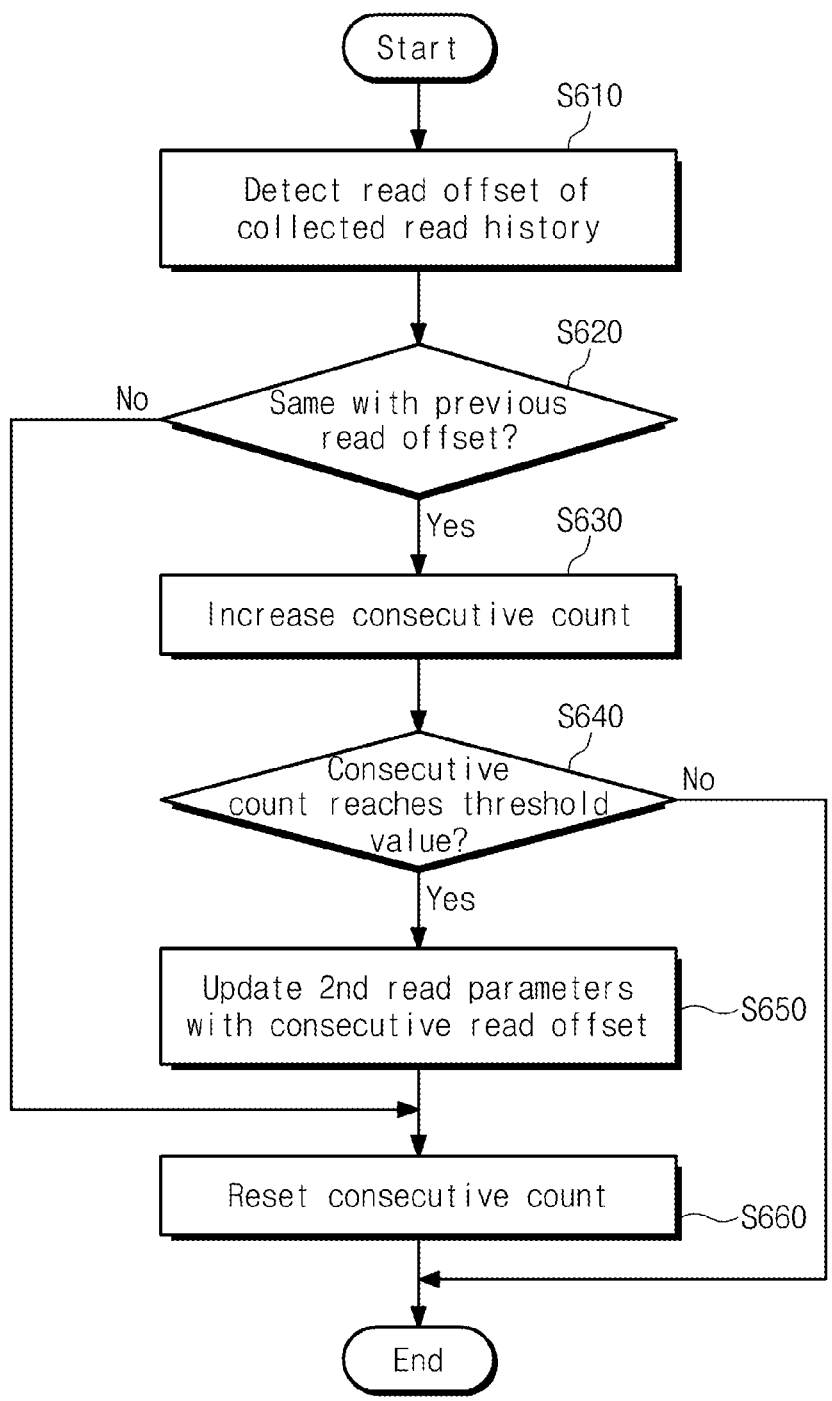
FIG. 13 is a flow chart for describing how a storage device updates second read parameters, according to another embodiment of the application.

FIG. 13 is a flow chart for describing how a storage device 100 updates second read parameters, according to another embodiment of the application. Referring to FIGS. 1 and 13, in step S610, a read offset of a collected read history is detected. For example, an operation corresponding to step S610 may be performed whenever a read history is collected.

In step S620, whether the detected read offset is the same as a previous read offset is determined. If so, the method may proceed to step S630, in which a consecutive count is increased. The consecutive count may indicate how many times the same read offset is consecutively collected. If the consecutive count reaches a critical value (S640), second read parameters may be updated using the consecutively collected read offset (S650). Afterwards, the consecutive count is reset (S660). If the consecutive count does not reach the critical value (S640), voting may not be performed.

Returning to step S620, if the detected read offset is not the same as the previous read offset, in step S660, the consecutive count may be reset.

As described above, the second read parameters are updated using a corresponding read offset when read offsets of read histories that correspond to one of a plurality of sets SET00 through SET11 of FIG. 7 and are consecutively collected are equal to one another. A method illustrated in FIG. 13 may be executed by a voting unit 129 or a read manager 128.

A voting count corresponding to an updated set of the second read parameters is reset when the second read parameters are updated according to a method illustrated in FIG. 13.

In FIGS. 3 through 13, an embodiment of the application is exemplified as memory cells at which data is written have an erase state E and first through seventh program states P1 through P7. However, the application is not limited thereto.

For example, the number of states of memory cells may be changed according to the number of bits that are written at one memory cell.

Figure 14:
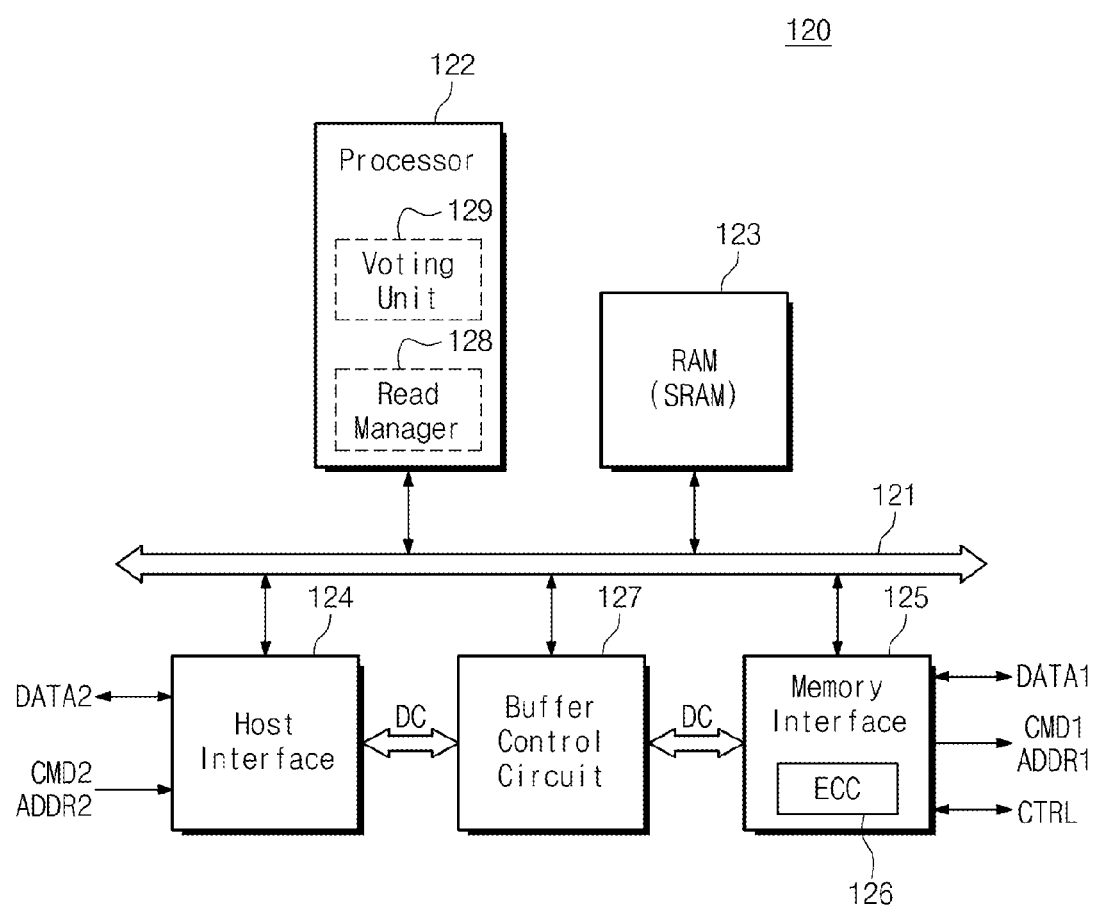
FIG. 14 is a block diagram schematically illustrating a memory controller according to an embodiment of the application.

FIG. 14 is a block diagram schematically illustrating a memory controller 120 according to an embodiment of the application. Referring to FIG. 14, a memory controller 120 contains a bus 121, a processor 122, a RAM 123, a host interface 124, a memory interface 125, and a buffer control circuit 127.

The bus 121 may be configured to provide a channel among components of the memory controller 120. For example, a second command CMD2 and a second address ADDR2 that are provided from an external host device to the memory controller 120 are transferred to the processor 122 through the bus 121. The processor 122 produces a first command CMD1 and a first address ADDR1, based on the second command CMD2 and the second address ADDR2. The first command CMD1 and the first address ADDR1 are transferred to the memory interface 125 through the bus 121. That is, the bus 121 provides a path through which a command and an address are transferred among the host interface 124, the processor 122, and the memory interface 125. Also, the bus 121 provides a control channel that enables the processor 122 to control the host interface 124, the memory interface 125, and the buffer control circuit 127. The bus 121 provides an access channel that enables the processor 122 to access the RAM 123.

The processor 122 controls an overall operation of the memory controller 120 and executes a logical operation. The processor 122 communicates with the external host device through the host interface 124. The processor 122 stores, in the RAM 123, the second command CMD2 or the second address ADDR2 received through the host interface 124. The processor 122 produces a first command CMD1 and a first address ADDR1 according to a command or an address stored in the RAM 123. The processor 122 outputs the first command CMD1 and the first address ADDR1 through the memory interface 125.

For example, the second address ADDR2 is a logical address that is used in a host device, and the first address ADDR1 is a physical address that is used in a nonvolatile memory 110. The processor 122 loads information, which is used to convert the second address ADDR2 into the first address ADDR1, on the RAM 123 and refers to information loaded on the RAM 123.

Under a control of the processor 122, data received through the host interface 124 is output through the buffer control circuit 127. Data received through the buffer control circuit 127 is transferred to the memory interface 125 under a control of the processor 122. Data received through the memory interface 125 is output through the buffer control circuit 127 according to a control of the processor 122. Under a control of the processor 122, data received through the buffer control circuit 127 is output through the host interface 124 or the memory interface 125.

The processor 122 contains a read manager 128 and a voting unit 129 that are described with reference to FIGS. 1 through 13. Each of the read manager 128 and the voting unit 129 may be software that the processor 122 runs or hardware that is implemented as a part of the processor 122.

The RAM 123 is used as a working memory, a cache memory, or a buffer memory of the processor 122. The RAM 123 stores codes or instructions that the processor 122 will execute. The RAM 123 stores data processed by the processor 122. The RAM 123 may include an SRAM.

The host interface 124 communicates with the external host according to a control of the processor 122. The host interface 124 may communicate using at least one of various communication manners such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), eMMC (embedded MMC), and so on.

The host interface 124 transfers the second command CMD2 and the second address ADDR2 received from the host device to the processor 122 through the bus 121. The host interface 124 transmits the second data DATA2 received from the host device to the buffer control circuit 127 through a data channel DC. The host interface 124 outputs the second data DATA2 received from the buffer control circuit 127 to the host device.

The memory interface 125 is configured to communicate with the nonvolatile memory 110 according to a control of the processor 122. The memory interface 125 receives the first command CMD1 and the first address ADDR1 from the processor 122 through the bus 121. The memory interface 125 outputs the first command CMD1 and the first address ADDR1 to the nonvolatile memory 110. Also, the memory interface 125 produces a control signal CTRL using the first command CMD1 and the first address ADDR1 and outputs the control signal CTRL to the nonvolatile memory 110.

The memory interface 125 receives the first data DATA1 from the buffer control circuit 127 through a data channel DC. The memory interface 125 outputs the first data DATA1 received through the data channel DC to the nonvolatile memory 110. The memory interface 125 receives the control signal CTRL and the first data DATA1 from the nonvolatile memory 110. The memory interface 125 transmits the first data DATA1 received from the nonvolatile memory 110 to the buffer control circuit 127 through the data channel DC.

The memory interface 125 contains an ECC block 126. The ECC block 126 performs an error correction operation. The ECC block 126 generates parity for error correction, based on data to be output to the nonvolatile memory 110 through the memory interface 125. Data and parity may be written at the nonvolatile memory 110. When the first data DATA1 is received from the nonvolatile memory 110, parity associated with the first data DATA1 is also received. The ECC block 126 corrects an error of the first data DATA1 using the first data DATA1 and the parity that are received through the memory interface 125.

The buffer control circuit 127 is configured to control the RAM 123 according to a control of the processor 122. The buffer control circuit 127 writes data at the RAM 123 and reads data from the RAM 123.

In exemplary embodiments, the processor 122 controls the memory controller 120 using codes. The processor 122 may read codes from a nonvolatile memory (e.g., read only memory) that is implemented in the memory controller 120 and may store the read codes at the RAM 123 for execution. Or, the processor 122 may store codes received through the memory interface 125 at the RAM 123 for execution.

In exemplary embodiments, the memory interface 125 or the processor 122 may further perform randomization on the first data DATA1 to be written at the nonvolatile memory 110. Randomization may be an operation of coding the first data DATA1 randomly or according to a predetermined rule, thereby preventing a specific pattern from being generated in the first data DATA1. Also, the memory interface 125 or the processor 122 may perform de-randomization on the first data DATA1 read from the nonvolatile memory 110.

In exemplary embodiments, the memory interface 125 or the processor 122 may further perform encryption to improve security of the first data DATA1 to be written at the nonvolatile memory 110. The memory interface 125 or the processor 122 may further perform decryption on the first data DATA1 read from the nonvolatile memory 110. The encryption and decryption may be made according to the standardized protocols such as DES (Data Encryption Standard), AES (Advanced Encryption Standard), and so on.

In exemplary embodiments, the memory controller 120 is configured to provide auxiliary power. For example, the memory controller 120 may store power supplied from a host device at a storing place such as a super cap. At sudden power-off, the memory controller 120 backs up an operating state of the memory controller 120 or writes data that is not yet stored in the nonvolatile memory 110, using the auxiliary power. The memory controller 120 performs a normal power-off sequence using the auxiliary power.

Figure 15:
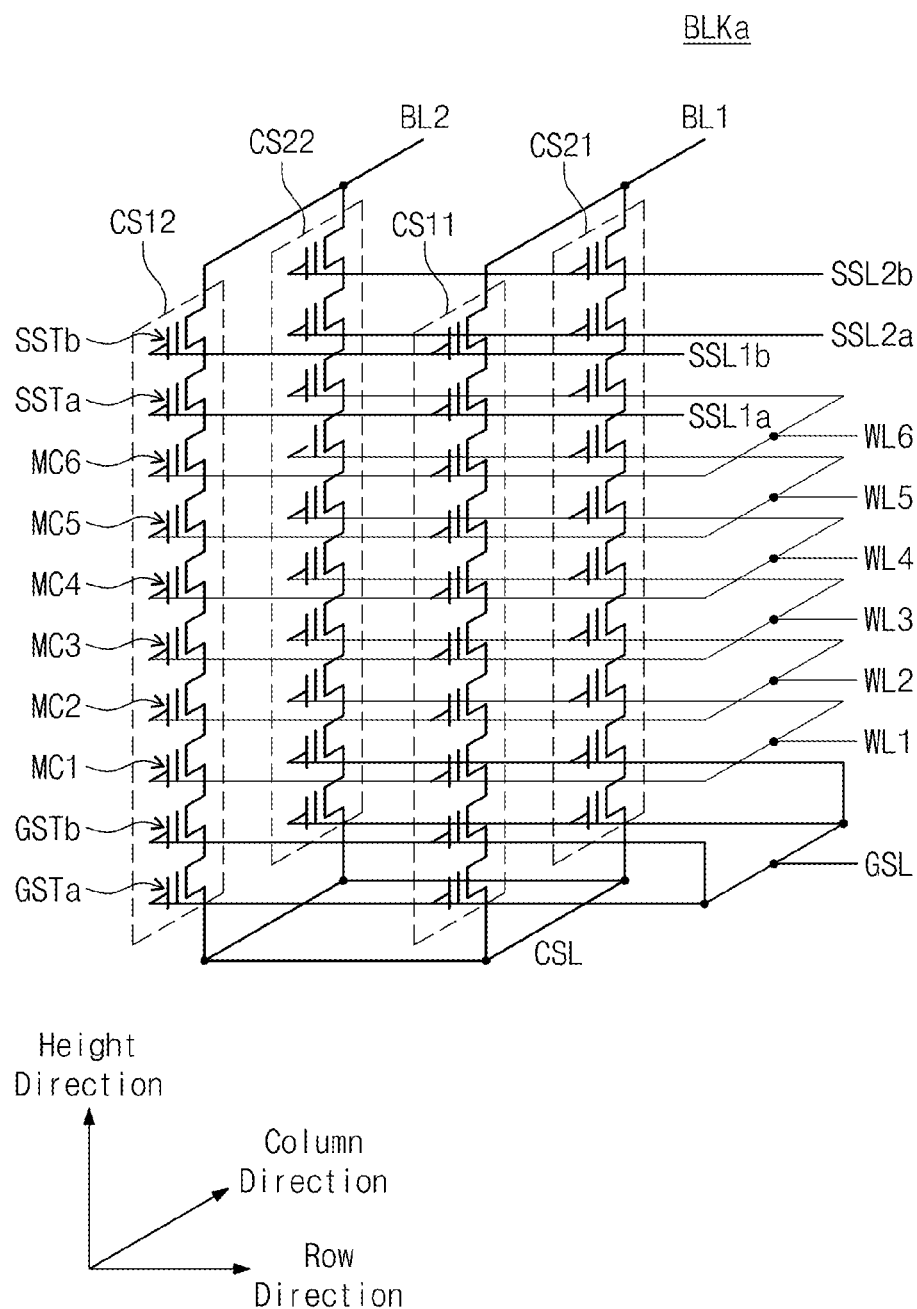
FIG. 15 is a circuit diagram schematically illustrating a memory block according to an embodiment of the application.

FIG. 15 is a circuit diagram schematically illustrating a memory block BLKa according to an embodiment of the application. Referring to FIG. 15, a memory block BLKa includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 through CS21 and CS12 through CS22 are connected in common to a ground selection line GSL.

In exemplary embodiments, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 through CS21 and CS12 through CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 through CS21 and CS12 through CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 through CS21 and CS12 through CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The cell strings CS11 and CS12 form a first plane, and the cell strings CS21 and CS22 form a second plane.

A write and a read operation of the memory block BLKa may be performed by the row. For example, one plane is selected by the string selection lines SSL1a, SSL1b, SSL2a, and SSL2b. Connected to the bit lines BL1 and BL2 are cell strings CS11 and CS12 of the first plane when a turn-on voltage is applied to the string selection lines SSL1a and SSL1b and a turn-off voltage is supplied to the string selection lines SSL2a and SSL2b. That is, the first plane is selected. Connected to the bit lines BL1 and BL2 are cell strings CS21 and CS22 of the second plane when a turn-on voltage is applied to the string selection lines SSL2a and SSL2b and a turn-off voltage is supplied to the string selection lines SSL1a and SSL1b. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased when the erase operation is performed by the memory block. The erase operation being performed by the sub block, a part of memory cells of the memory block BLKa may be erased and the rest thereof may be erase-inhibited. A low voltage (e.g., ground voltage) is supplied to a word line connected to memory cells to be erased, and a word line connected to memory cells to be erase-inhibited is floated.

The memory block BLKa shown in FIG. 15 is exemplary. However, the application is not limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

Figure 16:
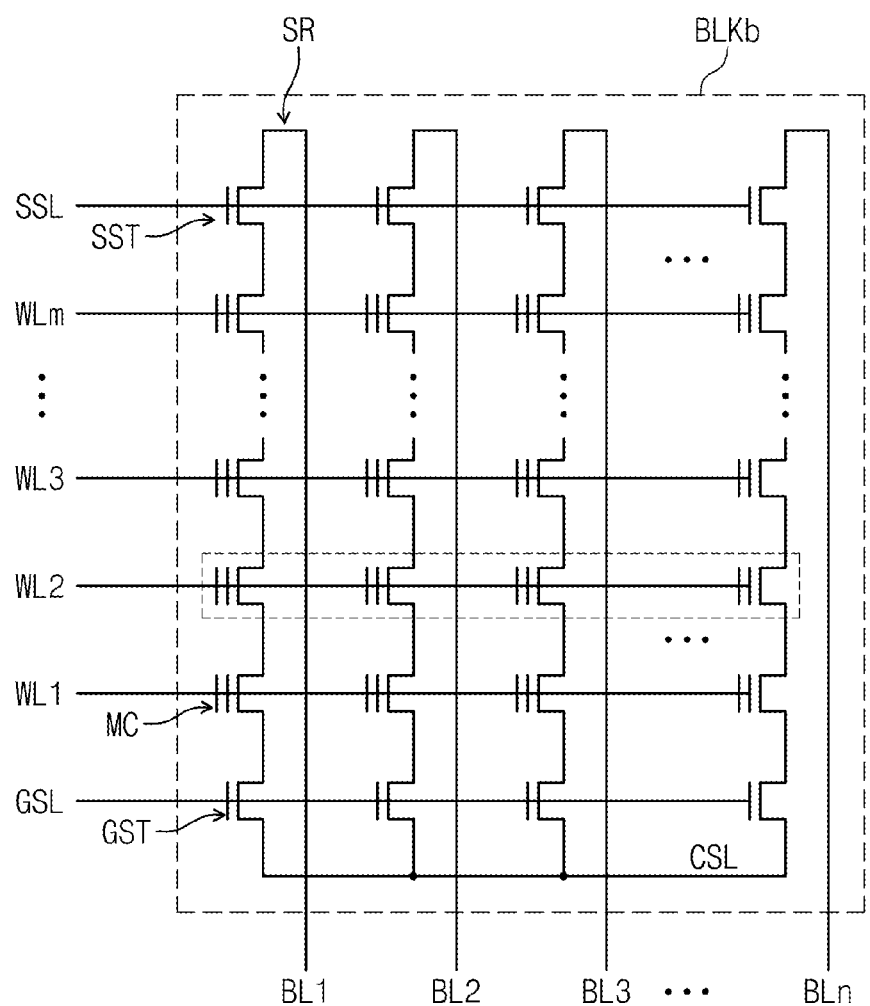
FIG. 16 is a circuit diagram schematically illustrating a memory block according to another embodiment of the application.

FIG. 16 is a circuit diagram schematically illustrating a memory block BLKb according to another embodiment of the application. Referring to FIG. 16, a memory block BLKb includes a plurality of strings SR, which are connected to a plurality of bit lines BL1 through BLn, respectively. Each string SR contains a ground selection transistor GST, memory cells MC, and a string selection transistor SST.

In each string SR, the ground selection transistor GST is connected between the memory cells MC and a common source line CSL. The ground selection transistors GST of the strings SR are connected in common to the common source line CSL.

In each string SR, the string selection transistor SST is connected between the memory cells MC and a bit line BL. The string selection transistors SST of the strings SR are connected to a plurality of bit lines BL1 through BLn, respectively.

In each string SR, the plurality of memory cells MC are connected between the ground selection transistor GST and the string selection transistor SST. In each string SR, the plurality of memory cells MC are connected in series.

In the strings SR, memory cells MC having the same height from the common source line CSL are connected in common to a word line. The string selection transistor SST included in each of the memory cell strings SR may be commonly connected to the string selection line SSL. The memory cells MC of the strings SR are connected to a plurality of word lines WL1 through WLm. The ground selection transistor GST included in each of the memory cell strings SR may be commonly connected to the ground selection line GSL.

In the memory block BLKb, an erase operation is performed by the memory block. When the erase operation is performed by the memory block, all memory cells of the memory block BLKb are simultaneously erased according to an erase request.

Figure 17:
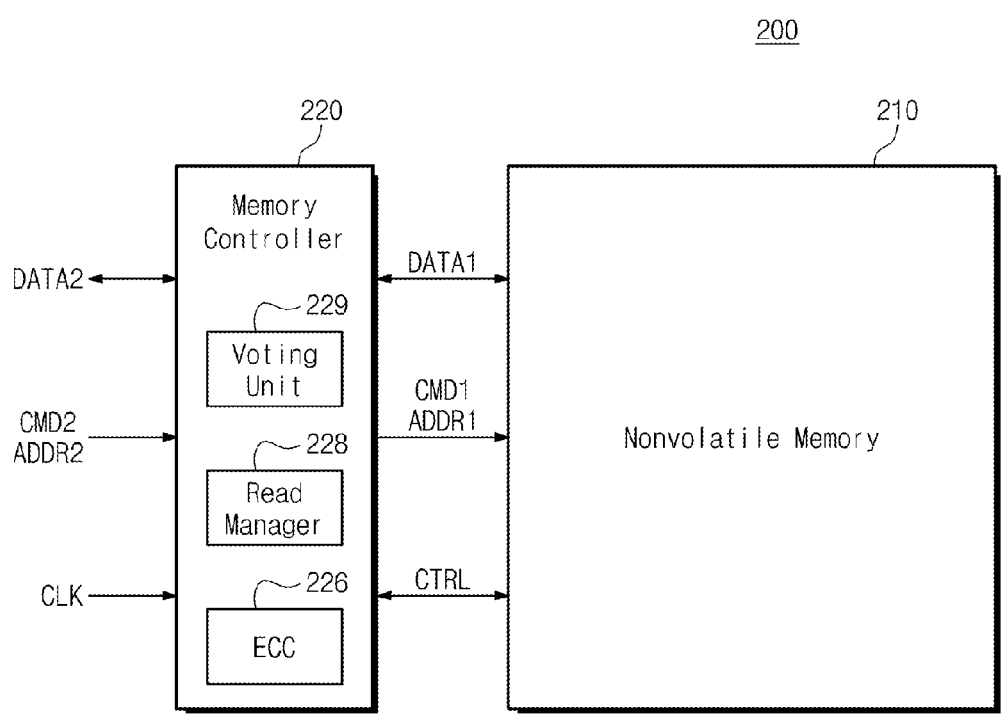
FIG. 17 is a block diagram schematically illustrating a storage device according to another embodiment of the application.

FIG. 17 is a block diagram schematically illustrating a storage device 200 according to another embodiment of the application. A storage device 200 shown in FIG. 17 is different from a storage device 100 shown in FIG. 1 in that it does not include a RAM 130. The storage device 200 may be a storage device that is embedded in a mobile device, such as a smart phone, a smart pad, and so on. The storage device 200 may be a memory card.

The nonvolatile memory 210, memory controller 220, voting unit 229, read manager 228, and ECC 226 of FIG. 17 operate similarly to the nonvolatile memory 110, memory controller 120, voting unit 129, read manager 128, and ECC 126 of FIG. 1, respectively. Thus, detailed descriptions of the operations of these devices is not repeated here.

Figure 18:
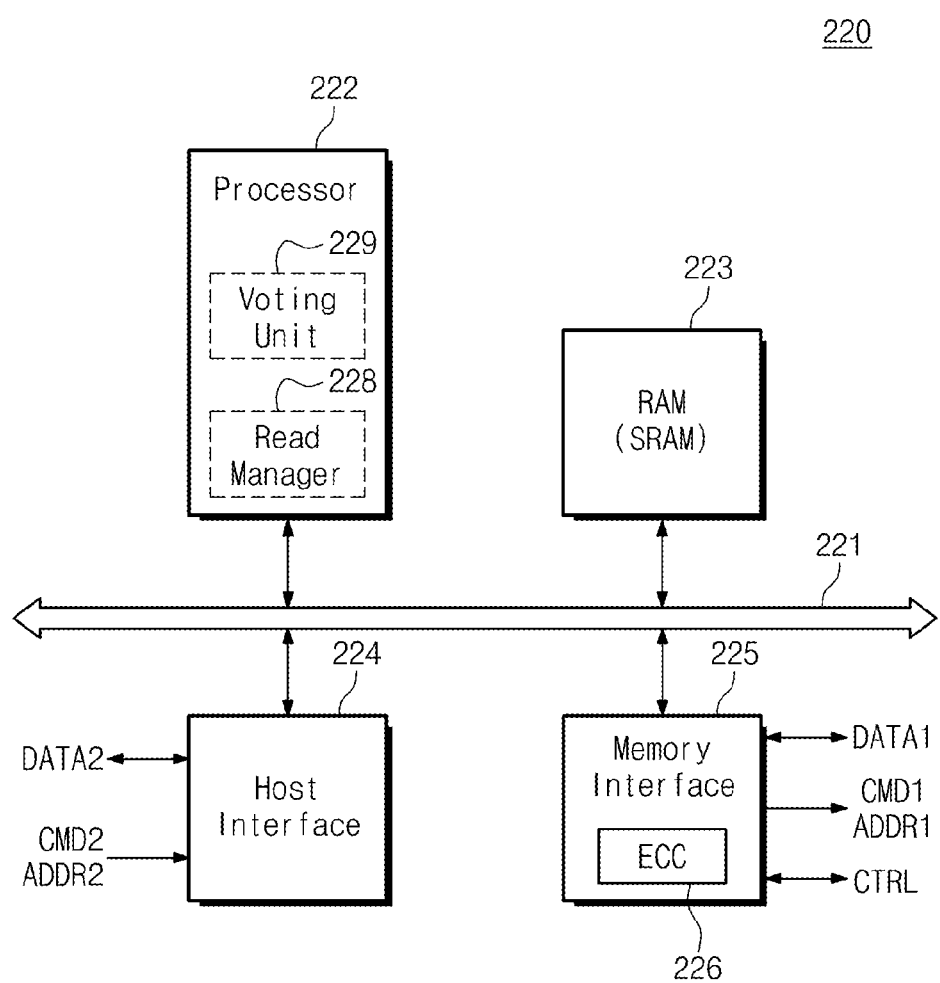
FIG. 18 is a block diagram schematically illustrating a memory controller shown in FIG. 17.

FIG. 18 is a block diagram schematically illustrating a memory controller 220 shown in FIG. 17. Referring to FIG. 18, a memory controller 220 contains a bus 221, a processor 222, a RAM 223, a host interface 224, and a memory interface 225. The memory controller 220 is different from a memory controller 120 shown in FIG. 14 in that it does not include a buffer control circuit 127.

The processor 222, RAM 223, host interface 224, memory interface 225, ECC 226, read manager 228, and voting unit 229 of the memory controller 220 illustrated by FIG. 18 operate similarly to the processor 122, RAM 123, host interface 124, memory interface 125, ECC 126, read manager 128, and voting unit 129 of the memory controller 120 illustrated by FIG. 14, respectively. Thus, detailed descriptions of the operations of these devices is not repeated here. However, communications between the host interface 224 and memory interface 225 of the memory controller 220 illustrated by FIG. 18 occur through the bus 221, rather than through a buffer control circuit as may occur with the memory controller 120 of FIG. 14.

The memory controller 220 may perform a variety of operations using the RAM 223, which the memory controller 120 shown in FIG. 14 performs using a RAM 130.

Figure 19:
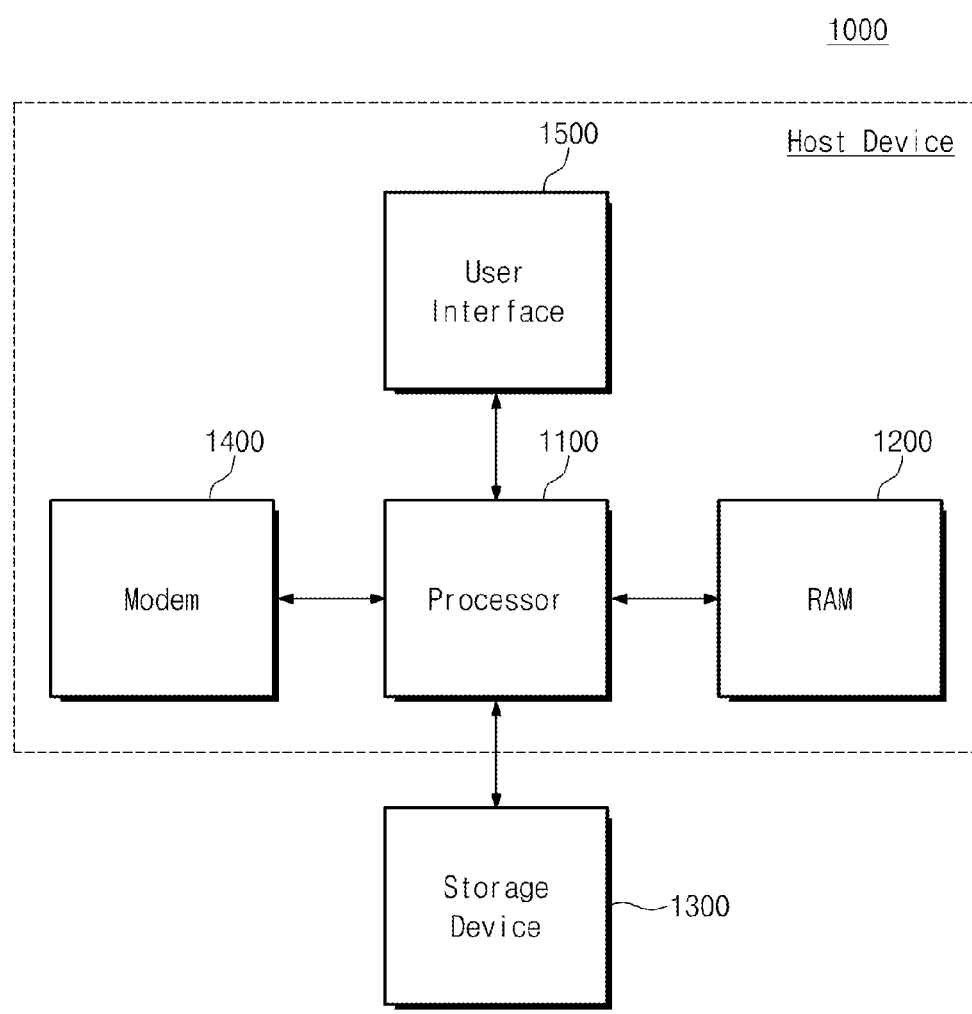
FIG. 19 is a block diagram schematically illustrating a computing device according to an embodiment of the application.

FIG. 19 is a block diagram schematically illustrating a computing device 1000 according to an embodiment of the application. Referring to FIG. 19, a computing device 1000 includes a processor 1100, a RAM 1200, a storage device 1300, a modem 1400, and a user interface 1500.

The processor 1100 controls an overall operation of the computing device 1000 and performs a logical operation. The processor 1100 is formed of a system-on-chip (SoC). The processor 1100 may be a general purpose processor, a specific-purpose processor, or an application processor.

The RAM 1200 communicates with the processor 1100. The RAM 1200 may be a main memory of the processor 1100 or the computing device 1000. The processor 1100 stores codes or data in the RAM 1200 temporarily. The processor 1100 executes codes using the RAM 1200 to process data. The processor 1100 executes a variety of software, such as, but not limited to, an operating system and an application, using the RAM 1200. The processor 1100 controls an overall operation of the computing device 1000 using the RAM 1200. The RAM 1200 may include a volatile memory such as, but not limited to, a static RAM, a dynamic RAM, a synchronous DRAM, and so on or a nonvolatile memory such as, but not limited to, a Phase-change RAM (PRAM), a Magnetic RAM (MRAM), a Resistive RAM (RRAM), a Ferroelectric RAM (FRAM), and so on.

The storage device 1300 communicates with the processor 1100. The storage device 1300 is used to store data for a long time. That is, the processor 110 stores data, which is to be stored for a long time, in the storage device 1300. The storage device 1300 stores a boot image for driving the computing device 1000. The storage device 1300 stores source code of a variety of software, such as an operating system and an application. The storage device 1300 stores data that is processed by a variety of software, such as an operating system and an application.

In exemplary embodiments, the processor 1100 loads source code stored in the storage device 1300 on the RAM 1200. The code loaded on the RAM 1200 is executed to run a variety of software, such as operating system, application, and so on. The processor 1100 loads data stored in the storage device 1300 on the RAM 1200 and processes data loaded on the RAM 1200. The processor 1100 stores long-term data of data stored in the RAM 1200 at the storage device 1300.

The storage device 1300 includes a nonvolatile memory, such as, but not limited to, a flash memory, a PRAM (Phase-change RAM), an MRAM (Magnetic RAM), an RRAM (Resistive RAM), an FRAM (Ferroelectric RAM), and so on.

The modem 1400 communicates with an external device according to a control of the processor 1100. For example, the modem 1400 communicates with the external device in a wire or wireless manner. The modem 1400 may communicate with the external device, based on at least one of wireless communications technologies such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on or wire communications technologies such as USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), eMMC (embedded MMC), and so on.

The user interface 1500 communicates with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an OLED (Organic Light Emitting Diode) display device, an AMOLED (Active Matrix OLED) display device, an LED, a speaker, a motor, and so on.

The storage device 1300 may include at least one of storage devices 100 and 200 according to embodiments of the application. The processor 1100, RAM 1200, modem 1400, and user interface 1500 may constitute a host device that communicates with the storage device 1300.

While the application has been described with reference to exemplary embodiments, it will be apparent to those skilled in the art that various changes and modifications may be made without departing from the spirit and scope of the present application. Therefore, it should be understood that the above embodiments are not limiting, but illustrative.

What is claimed is:

1. An operating method of a storage device which includes a nonvolatile memory and a memory controller configured to control the nonvolatile memory, the method comprising:
    performing a plurality of read operations with respect to data of the nonvolatile memory using first read parameters and second read parameters and collecting read histories associated with the plurality of read operations;
    determining first histories and second histories, based on the collected read histories;
    adjusting the second read parameters according to the first histories; and
    adjusting read parameters associated with the second histories, from among the first read parameters, according to the second histories, wherein:
    the read histories comprise information on read voltages used to perform the plurality of read operations, and
    the first histories and the second histories are determined from the collected read histories according to the number of read voltages, from among the read voltages, having the same level.

2. The operating method of claim 1, wherein the first read parameters include information on times when the data is respectively written at the nonvolatile memory.

3. The operating method of claim 1, wherein the second read parameters contain information on read voltages according to a difference between a current time and a time when read-requested data is written at the nonvolatile memory.

4. The operating method of claim 1, wherein the performing of the plurality of read operations with respect to data of the nonvolatile memory using first read parameters and second read parameters and collecting read histories associated with the plurality of read operations comprises:
    receiving a read command;
    determining levels of read voltages using the first read parameters and the second read parameters;
    performing a read operation according to the levels of the read voltages thus determined;
    when an error of data read through the read operation gets out of a correction range, adjusting the levels of the read voltages and performing a read-retry operation; and
    when the read-retry operation succeeds, collecting, as a read history, a read offset by which the levels of the read voltages are adjusted.

5. The operating method of claim 4, wherein the determining of the levels of the read voltages using the first read parameters and the second read parameters comprises:
    selecting the levels of the read voltages using the first and second read parameters, when a read history corresponding to the read command is not collected; and
    selecting the levels of the read voltages according to the first read parameters and the read history corresponding to the read command, when the read history corresponding to the read command is collected.

6. The operating method of claim 4, wherein the determining of the first histories and second histories based on the collected read histories comprises:
    selecting a first read offset whose value is the most common among read offsets of the collected read histories;
    selecting a second read offset value whose value is common among n read offsets of the collected read histories and the value of n is greater than a critical value, from among read offsets; and deciding read histories, corresponding to the selected first read offset and the selected second read offset, from among the collected read histories, as the first histories and the remaining read histories as the second histories.

7. The operating method of claim 4, wherein the determining of the first histories and second histories, based on the collected read histories, comprises:
calculating an average and a distribution of the read offsets;
selecting read histories, having read offsets within a critical distribution, from among the read histories as the first histories; and
selecting read histories having read offsets outside the critical distribution, from among the read histories, as the second histories.

8. The operating method of claim 1, wherein the determining of the first histories and second histories, the adjusting of the read parameters, and the adjusting of the second read parameters are performed whenever the number of collected read histories reaches a predetermined number.

9. The operating method of claim 8, wherein the determining of the first histories and second histories, the adjusting of the first read parameters, and the adjusting of the second read parameters are performed even though the number of the collected read histories is smaller than the predetermined number when the number of consecutively collected read histories with the same read offset reaches a critical value.

10. The operating method of claim 1, wherein the determining of the first histories and second histories, the adjusting of the read parameters, and the adjusting of the second read parameters are performed whenever the number of consecutively collected read histories with the same read offset reaches a predetermined number.

11. The operating method of claim 1, wherein a predetermined number of read histories are collected.

12. The operating method of claim 1, wherein if the number of the collected read histories reaches a predetermined number, an earliest accessed read history of the collected read histories is discarded whenever a new read history is collected.

13. A storage device comprising:
a nonvolatile memory; and
a memory controller adapted to control the nonvolatile memory, wherein:
the memory controller comprises:
an error correction code (ECC) block adapted to correct an error of data read from the nonvolatile memory;
a read manager adapted to control the nonvolatile memory such that a first read operation is performed using first read parameters and second read parameters and such that a second read operation is performed when a data error occurring with the first read operation is outside of an error correction range of the ECC block, the read manager being further adapted to store information on read levels of the second read operation as a read history when the second read operation succeeds; and
a voting unit adapted to update the first read parameters and the second read parameters using read histories collected by the read manager, and
the voting unit updates the second read parameters according to first histories of the collected read histories and updates the first read parameters according to second histories of the collected read histories, wherein
the voting unit identifies read histories that have the read offset value that is most common among the read histories as the first histories and identifies all other of the read histories as the second histories.

14. The storage device of claim 13, wherein:
the nonvolatile memory includes a plurality of cell strings arranged on a substrate along rows and columns, and
each cell string includes at least one ground selection transistor, a plurality of memory cells, and at least one string selection transistor sequentially stacked on the substrate in a direction perpendicular to the substrate.

15. An operating method of a memory controller, the method comprising:
receiving a request to read data from a nonvolatile memory;
determining whether information of one or more previously successful read voltages associated with the data exists;
performing a read operation of the data from the nonvolatile memory using the information of the one or more previously successful read voltages associated with the data, if such information is determined to exist; and
performing a read operation of the data from the nonvolatile memory using a read voltage identified in accordance with the difference between a current time for reading the data from the nonvolatile memory and a time associated with the writing of the data into the nonvolatile memory, if the information of the one or more previously successful read voltages associated with the data is determined not to exist.

16. The method of claim 15, wherein the read voltage is further identified in accordance with an erase count for the memory cell storing the data to be read, if the information of the one or more previously successful read voltages associated with the data is determined not to exist.

17. The method of claim 15, wherein the determination of whether the information of the one or more previously successful read voltages associated with the data exists is made by:
identifying the difference between the current time for reading the data from the nonvolatile memory and the time associated with the writing of the data into the nonvolatile memory; and
determining whether the information of the one or more previously successful read voltages exists for the identified time difference.

18. The method of claim 15, further comprising:
storing information corresponding to the read voltage used to perform each read operation associated with the data in a read history file; and
performing each read operation of the data from the nonvolatile memory with a read voltage determined from a value obtained by a majority vote among stored values of the information corresponding to the read voltages used to perform read operations associated with the data, when enough such information exists within the read history file to conduct a majority vote, wherein
the majority vote determines the most common value stored in the read history file for the data.

19. The method of claim 18, wherein the majority vote considers only the stored values that:
are common to N or more read operations for the data in the read history file, where N is a predetermined positive integer, or
fall within a predetermined distribution of the values for the data in the read history file.

20. The method of claim 19, wherein the values considered by the majority vote are used to update the information of the one or more previously successful read voltages associated with the data.

21. The method of claim 15, further comprising:
storing information corresponding to the read voltage used to perform each read operation associated with the data in a read history file;
counting the number of consecutive times the same read voltage is used to perform a read operation associated with the data in the read history file; and
updating, when the count reaches a predetermined number, the information of the one or more previously successful read voltages associated with the data using the stored information corresponding to the read voltages used to perform read operations associated with the data in the read history file.

* * * * *